(12) United States Patent
Li et al.

(10) Patent No.: US 7,652,280 B2
(45) Date of Patent: Jan. 26, 2010

(54) LIGHT-EMITTING DEVICE AND ARTICLE

(75) Inventors: Yun Li, Niskayuna, NY (US); Jie Liu, Niskayuna, NY (US); Anping Zhang, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 19 days.

(21) Appl. No.: 11/767,153

(22) Filed: Jun. 22, 2007

(65) Prior Publication Data

US 2008/0251780 A1 Oct. 16, 2008

Related U.S. Application Data

(63) Continuation-in-part of application No. 11/733,901, filed on Apr. 11, 2007.

(51) Int. Cl.
*H01L 33/00* (2006.01)
(52) U.S. Cl. .................. 257/13; 257/79; 257/E33.005; 977/762
(58) Field of Classification Search .................. 257/13, 257/79, E33.005; 977/762
See application file for complete search history.

(56) References Cited

U.S. PATENT DOCUMENTS

| 4,894,298 | A | 1/1990 | Campbell et al. |
|---|---|---|---|
| 4,894,299 | A | 1/1990 | Weaver et al. |
| 4,895,776 | A | 1/1990 | Kawasei |
| 5,919,551 | A | 7/1999 | Cobb, Jr. et al. |
| 2003/0168964 | A1 | 9/2003 | Chen |
| 2006/0098705 | A1* | 5/2006 | Wang et al. ............ 372/50.124 |
| 2007/0131949 | A1 | 6/2007 | Liu |
| 2007/0159072 | A1* | 7/2007 | Oh .............................. 313/504 |
| 2009/0002266 | A1* | 1/2009 | Li et al. .......................... 345/6 |

FOREIGN PATENT DOCUMENTS

| EP | 1515295 A2 | 3/2006 |
|---|---|---|
| WO | 2004017678 A2 | 2/2004 |
| WO | 2006051994 A2 | 5/2006 |
| WO | 2006078286 A2 | 7/2006 |
| WO | 2006091823 A2 | 8/2006 |
| WO | 2006138072 A1 | 12/2006 |
| WO | WO2007097545 A1 | 8/2007 |

OTHER PUBLICATIONS

European Search Report dated Jan. 16, 2009.
Liu, "Color Tunable Light-Emitting Devices and Method of Making the Same", Pending U.S. Appl. No. 11/299,925, filed Dec. 12, 2005, GE Docket No. 166471-1.
Liu, "Color Tunable Light-Emitting Devices and Method of Making the Same", Pending U.S. Appl. No. 11/301,167, filed Dec. 12, 2005, GE Docket No. 166471-2.

* cited by examiner

*Primary Examiner*—Victor A Mandala
(74) *Attorney, Agent, or Firm*—Patrick K. Patnode

(57) ABSTRACT

A device comprising a light transmissive element, a nano-wire light-emitting device, and a light transmissive controller communicating with the nano-wire light-emitting device. The nano-wire light-emitting device, and the light transmissive controller, are supported by the light transmissive element. An article includes two or more of the devices.

29 Claims, 25 Drawing Sheets

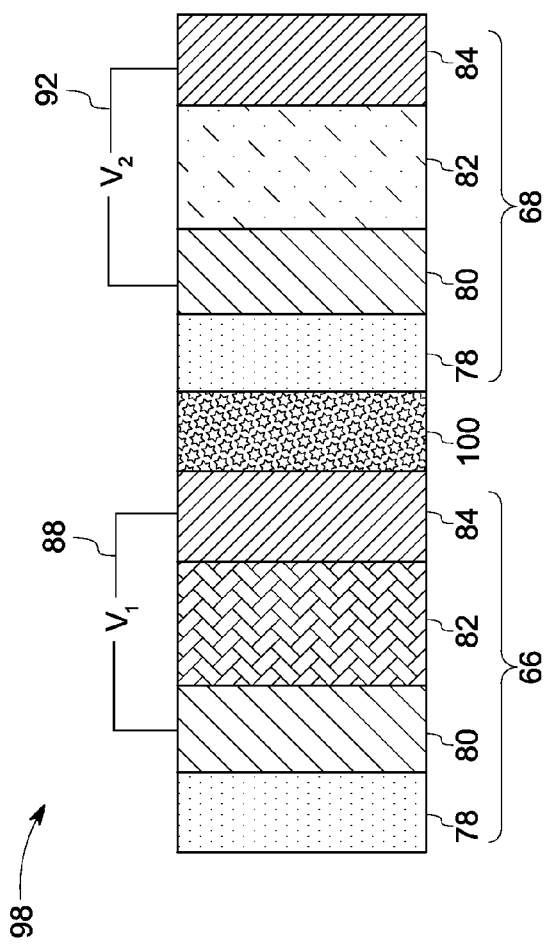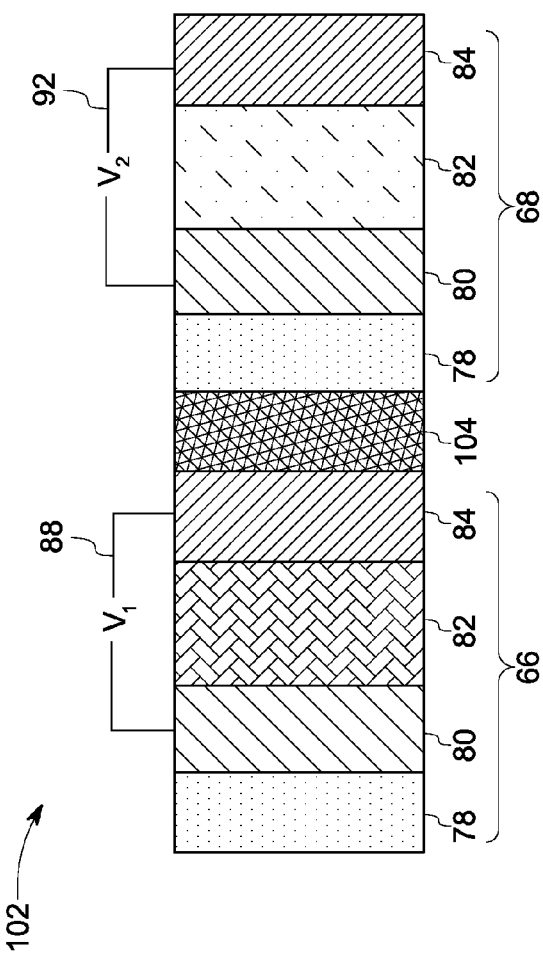

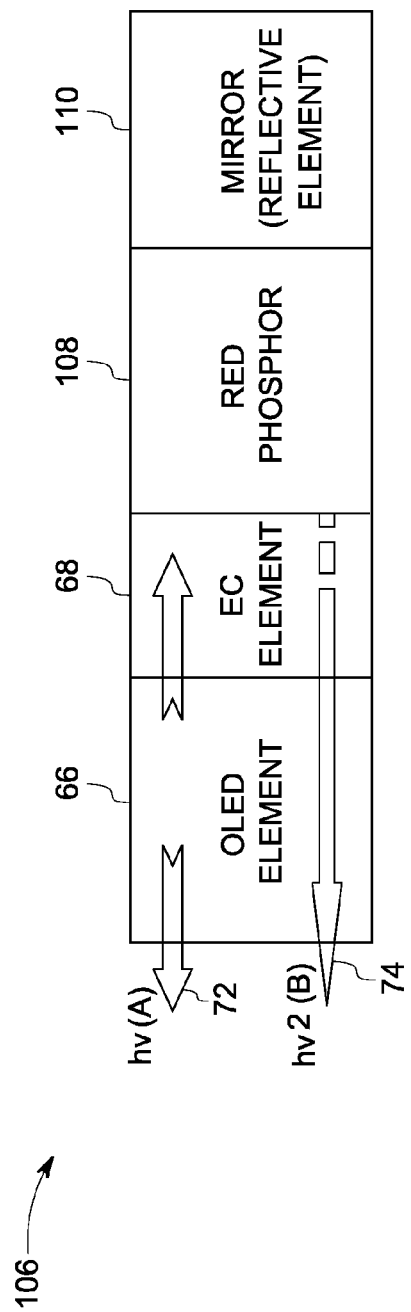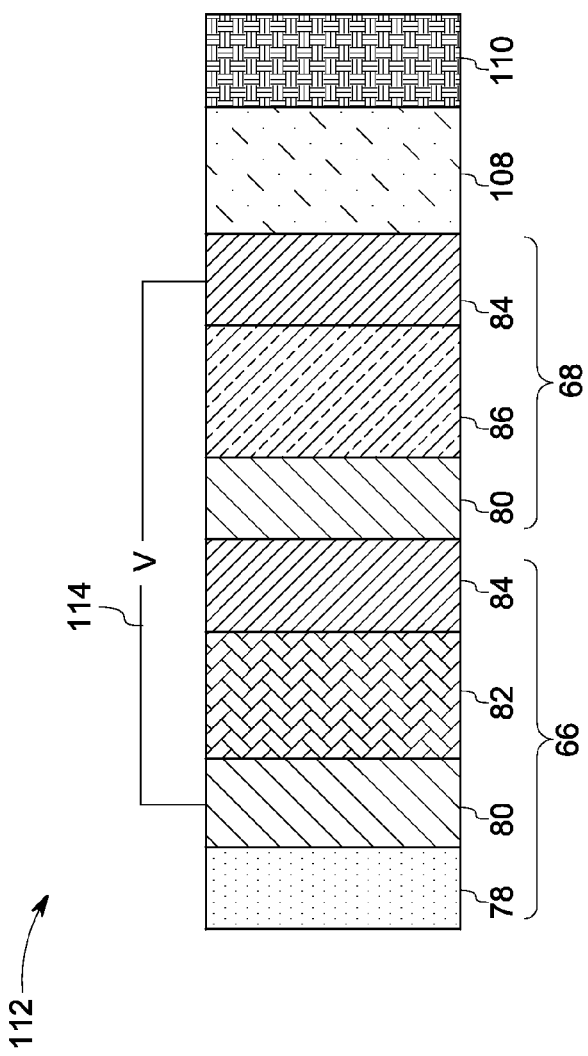
FIG. 16
FIG. 17

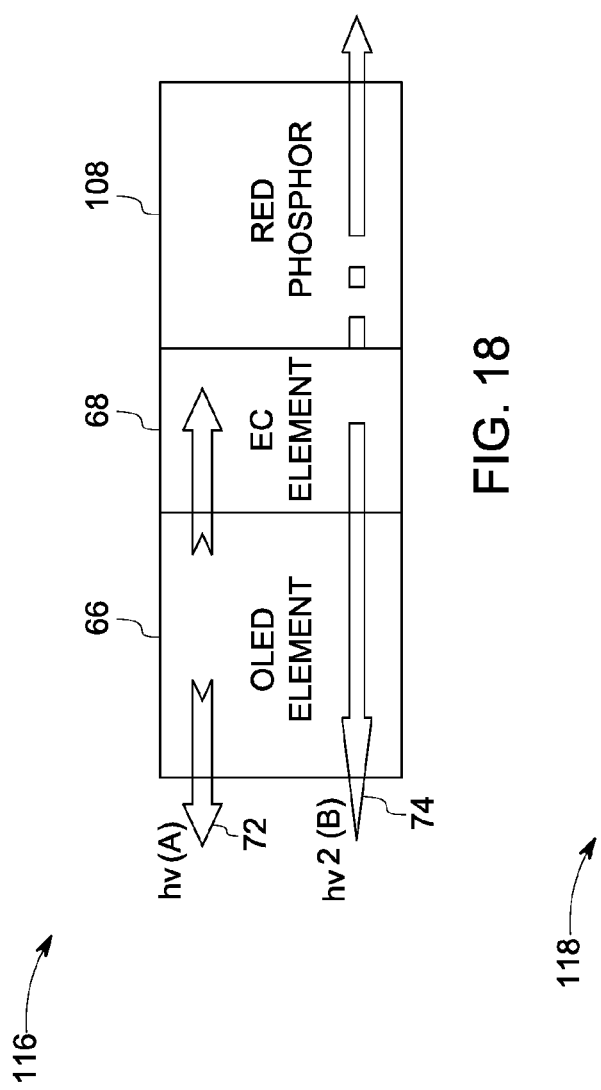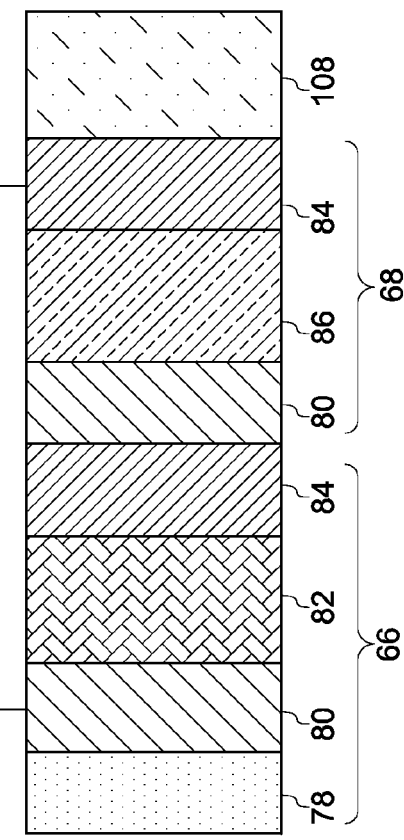

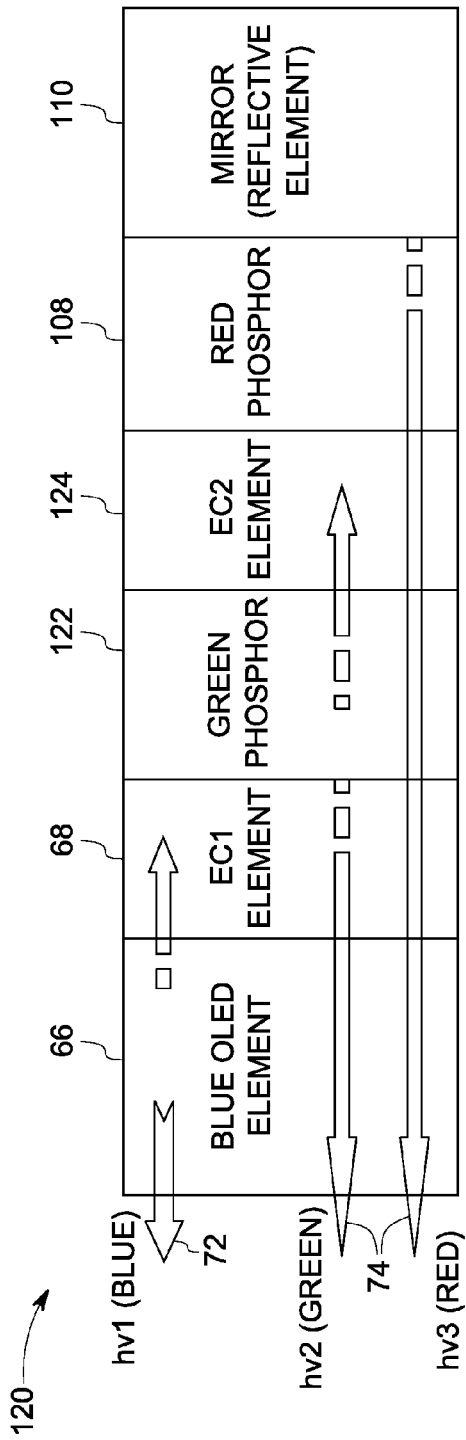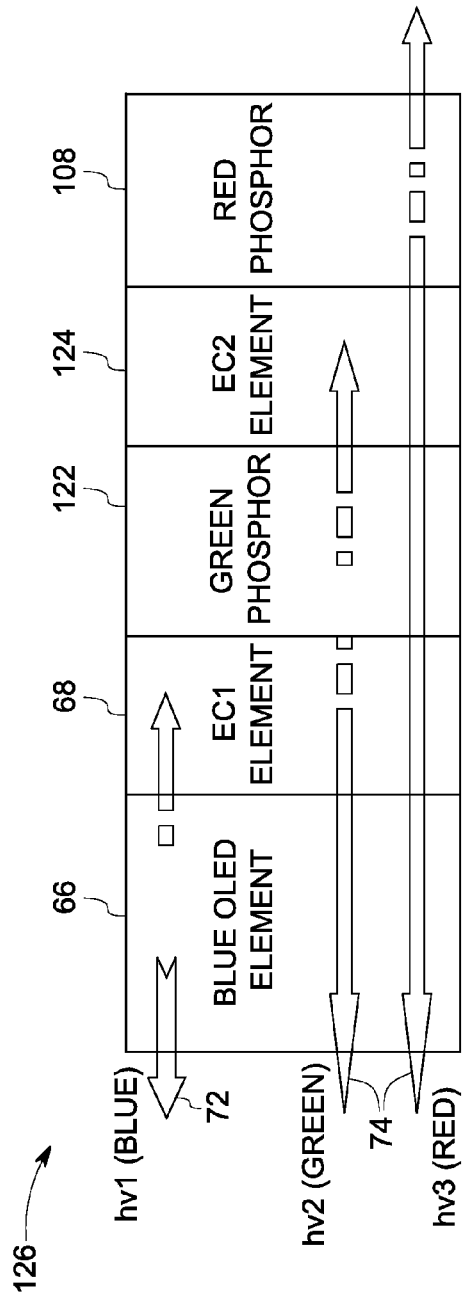

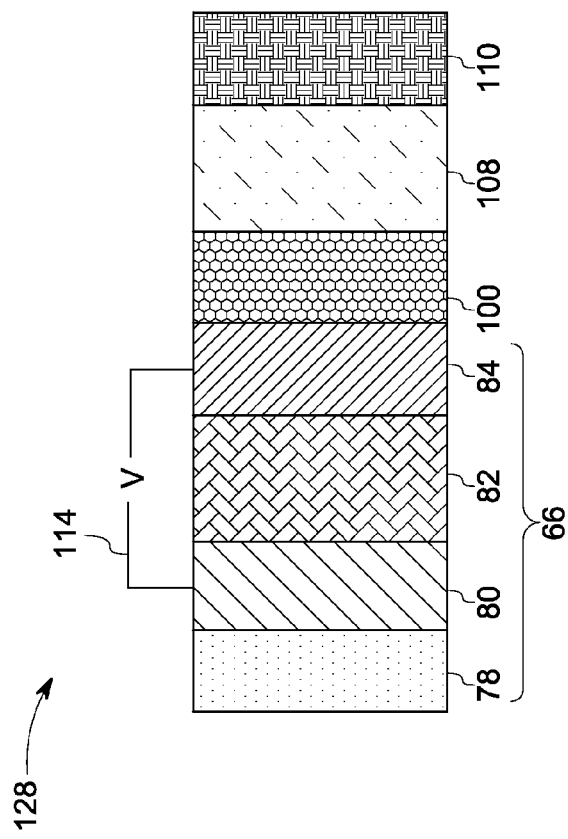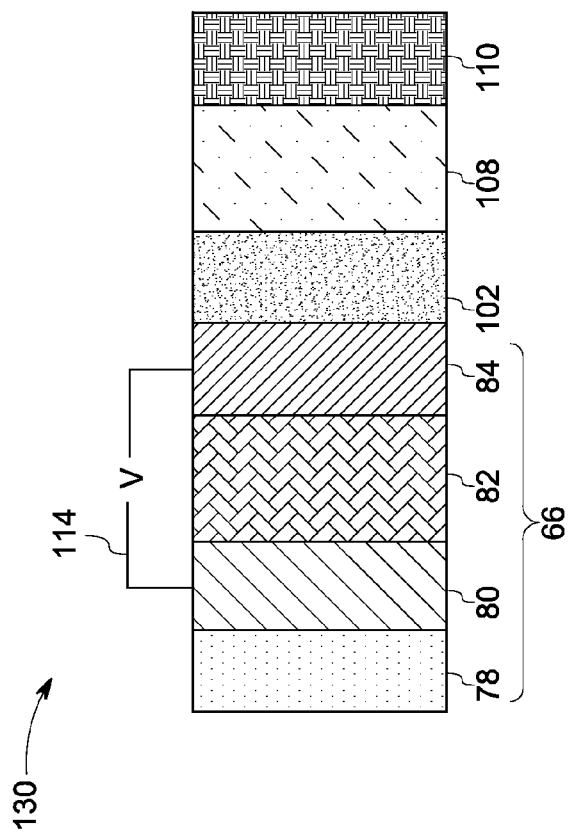

LIGHT-EMITTING DEVICE AND ARTICLE

CROSS REFERENCE TO RELATED APPLICATIONS

This application is a continuation-in-part of U.S. patent application Ser. No. 11/733,901, entitled "LIGHT-EMITTING DEVICE AND ARTICLE", filed on Apr. 11, 2007.

BACKGROUND

1. Technical Field

The invention includes embodiments that relate to a device. The invention includes embodiments that relate to an article. Embodiments of the device and article may emit light.

2. Discussion of Art

An organic light-emitting device (OLED) may be used for flat panel backlight or for illumination. Some devices or models have a fixed color. The color may be an intrinsic color that is emitted by the OLED. Such a color conversion technique may include stacking red, green, and/or blue light-emitting devices, or by using a photoluminescent layer.

For interior/exterior decorations and signage, it may be desirable to obtain a desired color output. It may be desirable to have a device with differing characteristics or properties than those devices that are currently available.

BRIEF DESCRIPTION

A device is provided in one embodiment of the invention. The device includes at least one light transmissive element, at least one nano-wire light-emitting device, and at least one light transmissive controller. The nano-wire light-emitting device, the light transmissive controller, and the light transmissive element are secured to each other.

BRIEF DESCRIPTION OF THE DRAWINGS

Like numbers represent like parts throughout the drawings, wherein:

FIG. 14 is a cross-sectional representation of an embodiment of a color-tunable light-emitting device;

FIG. 15 is a cross-sectional representation of an embodiment of a color-tunable light-emitting device;

FIG. 16 is a schematic representation of an embodiment of a color-tunable light-emitting device;

FIG. 17 is a cross-sectional representation of an embodiment of a color-tunable light-emitting device;

FIG. 18 is a schematic representation of an embodiment of a color-tunable light-emitting device;

FIG. 19 is a cross-sectional representation of an embodiment of a color-tunable light-emitting device;

FIG. 20 is a schematic representation of an embodiment of a color-tunable light-emitting device;

FIG. 21 is a schematic representation of an embodiment of a color-tunable light-emitting device;

FIG. 22 is a cross-sectional representation of an embodiment of a color-tunable light-emitting device;

FIG. 23 is a cross-sectional representation of an embodiment of a color-tunable light-emitting device;

DETAILED DESCRIPTION

Figure 1:
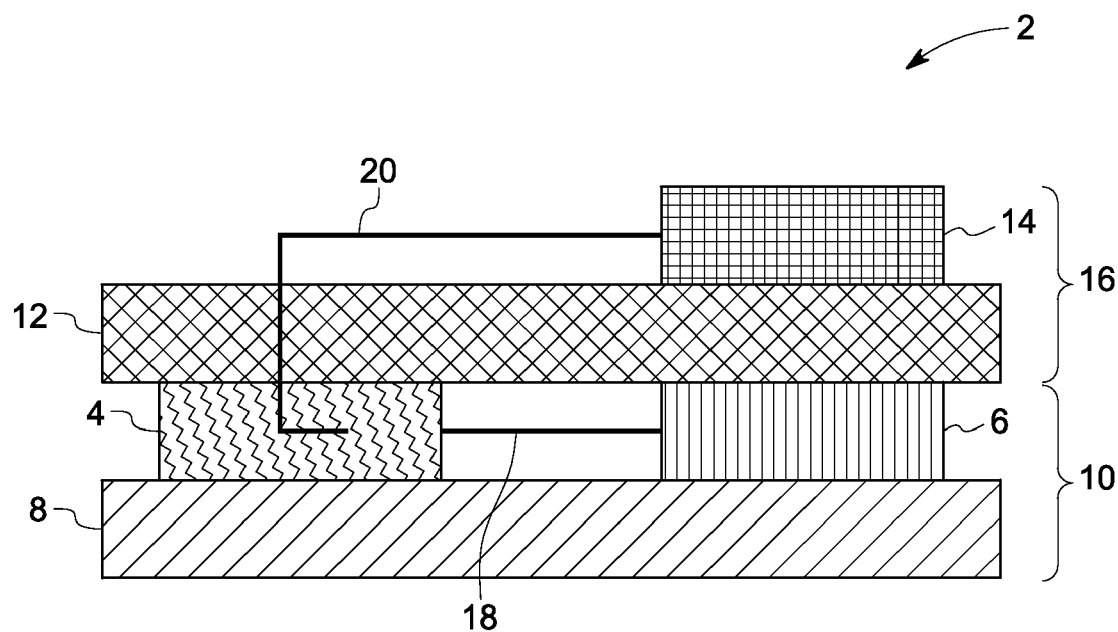
FIG. 1 is a schematic representation of an embodiment of a device according to the invention.

The invention includes embodiments that relate to a device for use as a light source. The invention includes embodiments that relate to an article incorporating the device.

The singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term or terms, such as "about" is not limited to the precise value specified. In some instances, the approximating language may correspond to the precision of an instrument for measuring the value. Similarly, "free" may be used in combination with a term, and may include an insubstantial number, or trace amounts, while still being considered free of the modified term.

As used herein, the term "nano-wire" refers to an inorganic semiconducting wire having diameter or cross-section of less than 1 micrometer, and length of mor than a few micrometers. As used herein, the term "nano-wire light-emitting device" nano-LED refers to a light-emitting device including one nanowire p-n or p-i-n diode or multiple p-n or p-i-n diodes wherein the nanowire device emits light. As used herein, the term "secured to" or "disposed over" or "deposited over" or "disposed between" refers to both secured or disposed directly in contact with and indirectly by having intervening layers therebetween. "Operably coupled" is a relationship between listed parts that provides a stated function. Without further qualifiers, "light transmissive" means that greater than about 50 percent of light of at least one frequency in the visible wavelength range transmits through a material of a given thickness. The visible wavelength range is about 400 nanometers to about 700 nanometers. Some materials transmit more or less light based on the wavelength of the light. That is, a material that is light transmissive at one frequency may be more or less transmissive at another wavelength.

The term "alkyl" as used in the various embodiments of the invention is intended to designate linear alkyl, branched alkyl, aralkyl, cycloalkyl, bicycloalkyl, tricycloalkyl and polycycloalkyl radicals comprising carbon and hydrogen atoms. Alkyl groups may be saturated or unsaturated, and may comprise, for example, vinyl or allyl. The term "alkyl" also encompasses that alkyl portion of alkoxide groups. In various embodiments, normal and branched alkyl radicals are those containing from 1 to about 32 carbon atoms, and include as illustrative non-limiting examples $C_1$-$C_{32}$ alkyl (optionally substituted with one or more groups selected from $C_1$-$C_{32}$ alkyl, $C_3$-$C_{15}$ cycloalkyl or aryl); and $C_3$-$C_{15}$ cycloalkyl optionally substituted with one or more groups selected from $C_1$-$C_{32}$ alkyl or aryl. Examples include methyl, ethyl, n-propyl, isopropyl, n-butyl, sec-butyl, tertiary-butyl, pentyl, neopentyl, hexyl, heptyl, octyl, nonyl, decyl, undecyl and dodecyl. Some illustrative non-limiting examples of cycloalkyl and bicycloalkyl radicals include cyclobutyl, cyclopentyl, cyclohexyl, methylcyclohexyl, cycloheptyl, bicycloheptyl and adamantyl. In various embodiments, aralkyl radicals include those containing from 7 to about 14 carbon atoms; these include benzyl, phenylbutyl, phenylpropyl, and phenylethyl.

The term "aryl" as used in embodiments of the invention designates substituted or unsubstituted aryl radicals comprising from 6 to 20 ring carbon atoms. Some examples of aryl radicals include $C_6$-$C_{20}$ aryl optionally substituted with one or more groups selected from $C_1$-$C_{32}$ alkyl, $C_3$-$C_{15}$ cycloalkyl, aryl, and functional groups including atoms selected from Groups 15, 16 and 17 of the Periodic Table. Examples of aryl radicals include substituted or unsubstituted phenyl, biphenyl, tolyl, xylyl, naphthyl, and bi-napthyl.

In one embodiment, the device may include at least one light transmissive element. Each of a plurality of light transmissive organic electronic devices secure to the single light transmissive element. At least one light transmissive controller is secured to the light transmissive element. The light transmissive controller connects to at least two light transmissive organic electronic devices. The device may be used in applications where see through/transparent articles are required, such as for example, multilayer information display or signage, head-up display or signage, and illumination devices.

The light transmissive element may be formed from a light transmissive material. The light transmissive material can be clear in one embodiment. In another embodiment, the light transmissive material can have a color, tint, or optical effect inducing quality (such as opalescence or polarization). In one embodiment, without regard for wavelength or thickness, the amount of light transmitted through the light transmissive element is in a range of from about 60 percent to about 70 percent, from about 70 percent to about 80 percent, or from about 80 percent to about 90 percent of the light. In one embodiment, without regard for percent transmission or thickness, the transmitted light may have a wavelength in a range of from about 400 nanometers to about 500 nanometers, from about 500 nanometers to about 600 nanometers, or from about 600 nanometers to about 700 nanometers. In one embodiment, more than about 50 percent of the light at wavelength of about 550 nanometers is transmitted through the light transmissive element without regard for the thickness. The above-discussed embodiments on the amount and the wavelength of transmitted light hold true for the light transmissive organic electronic devices, the light transmissive controller, the resultant device and the article made therefrom. Thickness of various embodiments are disclosed hereinbelow.

Suitable light transmissive elements may include a transparent substrate. The substrate may be chosen from a group of rigid substrates and flexible substrates. The rigid substrates include but are not limited to glass, metal and plastic; and the flexible substrates include flexible glass, metal foil, and plastic films. Non-limiting examples of glass may include quartz glass and borosilicate glass. Non-limiting examples of plastic may include organic polymers. Suitable organic polymers may include thermoplastic polymers chosen from polyethylene terephthalate, polyethylene naphthalate, polyethersulfone, polycarbonate, polyimide, polyacrylate, polyolefin, and the like. The light transmissive element forms a part of the device and may also be a separate substrate layer relative to the light transmissive organic electronic devices.

In one embodiment, the light transmissive organic electronic device may include an organic light-emitting device (OLED). In one embodiment, the OLED comprises a first electrode anode and a second electrode cathode. An electroluminiscent layer is disposed between the first electrode and the second electrode. The first electrode and second electrode are operably coupled to at least one tunable voltage source.

Suitable anodes may include a material having a high work function; e.g., greater than about 4.0 electron volts. In one embodiment, the anode material work function may be in a range of from about 5 electron volts to about 6 electron volts, or from about 6 electron volts to about 7 electron volts. Transparent metal oxides, such as indium tin oxide "ITO", may be used for this purpose. ITO is light transmissive and allows light emitted from the organic emissive layer to escape through the ITO anode without being seriously attenuated. Other materials suitable for use as the anode are tin oxide, indium oxide, zinc oxide, indium zinc oxide, zinc indium tin oxide, antimony oxide, and mixtures thereof. The thickness of an anode including such an electrically conducting oxide may be greater than about 10 nanometers. In one embodiment, the thickness may be in the range of from about 10 nanometers to about 50 nanometers, from about 50 nanometers to about 100 nanometers, or from about 100 nanometers to about 200 nanometers.

In one embodiment, a thin transparent layer of a metal is suitable for the anode. A transparent metal layer may have a thickness of less than or equal to about 50 nanometers. In one embodiment, the metal thickness may be in a range of from about 50 nanometers to about 20 nanometers. Suitable metals for the anode may include, for example, silver, copper, tungsten, nickel, cobalt, iron, selenium, germanium, gold, platinum, aluminum, or mixtures thereof or alloys thereof. The anode may be deposited on the underlying element by a technique such as physical vapor deposition, chemical vapor deposition, or sputtering.

The cathode injects negative charge carriers electrons into the organic emissive layer and may be made of a material having a low work function; for example, less than about 4 electron volts. Not every material suitable for use as the cathode need have a low work function. Materials suitable for use as the cathode may include K, Li, Na, Mg, Ca, Sr, Ba, Al, Ag, In, Sn, Zn, Zr, Sc, and Y. Other suitable materials may include elements of the lanthanide series, alloys thereof, or mixtures thereof. Examples of suitable alloy materials for the manufacture of cathode layer may include Ag—Mg, Al—Li, In—Mg, and Al—Ca alloys. Layered non-alloy structures may be used. Such layered non-alloy structures may include a thin layer of a metal such as Ca having a thickness in a range of from about 1 nanometer to about 50 nanometers. Other such layered non-alloy structures may include a non-metal such as LiF, KF, or NaF, over-capped by a thicker layer of some other metal. A suitable other metal may include aluminum or silver. The cathode may be deposited on the underlying layer by, for example, physical vapor deposition, chemical vapor deposition, or sputtering.

Suitable OLEDs may include an electroluminescent layer, which may be referred to as an organic emissive layer or as a light-emitting layer. Electroluminescent (EL) materials refer to organic fluorescent and/or phosphorescent materials. Electroluminescent materials emit light when subjected to an applied voltage bias. Electroluminescent materials may be tailored to emit light in a determined wavelength range. In one embodiment, the thickness of the electroluminescent layer may be greater than about 40 nanometers. In one embodiment, the thickness may be less than about 300 nanometers. The electroluminescent material may be a polymer, a copolymer, or a mixture of polymers. Suitable electroluminescent materials may include poly N-vinylcarbazole (PVK) and its derivatives; polyfluorene and its derivatives, such as poly-alkylfluorene, for example poly-9,9-dihexylfluorene, poly-dioctylfluorene, or poly-9,9-bis-3,6-dioxaheptyl-fluorene-2,7-diyl; poly para-phenylene and its derivatives, such as poly-2-decyloxy-1,4-phenylene or poly-2,5-diheptyl-1,4-phenylene; polyp-phenylene vinylene and its derivatives, such as dialkoxy-substituted PPV and cyano-substituted PPV; polythiophene and its derivatives, such as poly-3-alkylthiophene, poly-4,4'-dialkyl-2,2'-bithiophene, poly-2,5-thienylene vinylene; polypyridine vinylene and its derivatives; polyquinoxaline and its derivatives; and polyquinoline and its derivatives. In one embodiment, a suitable electroluminescent material is poly-9,9-dioctylfluorenyl-2,7-diyl end capped with N,N-bis 4-methylphenyl-4-aniline. Mixtures of these polymers or copolymers based on one or more of these polymers may be used.

Other suitable materials that may be used as electroluminescent materials are polysilanes. Polysilanes are linear polymers having a silicon-backbone substituted with an alkyl and/or aryl side groups. Polysilanes are quasi one-dimensional materials with delocalized sigma-conjugated electrons along polymer backbone chains. Examples of polysilanes include poly di-n-butylsilane, poly di-n-pentylsilane, poly di-n-hexylsilane, polymethyl phenylsilane, and poly bis p-butyl phenylsilane.

In one embodiment, organic materials having molecular weight less than about 5000, including aromatic units, may be used as electroluminiscent materials. An example of such materials is 1,3,5-tris N-4-diphenyl amino phenyl phenyl amino benzene, which emits light in the wavelength range of from about 380 nanometers to about 500 nanometers. These electroluminiscent layer organic materials may be prepared from organic molecules such as phenylanthracene, tetraarylethene, coumarin, rubrene, tetraphenylbutadiene, anthracene, perylene, coronene, or their derivatives. These materials may emit light having a maximum wavelength of about 520 nanometers. Still other suitable materials are the low molecular-weight metal organic complexes such as aluminum-acetylacetonate, gallium-acetylacetonate, and indium-acetylacetonate, which emit light in the wavelength range of about 415 nanometers to about 457 nanometers, aluminum picolymethylketone bis-2,6-dibutylphenoxide or scandium-4-methoxy picolyl methyl ketone-bis acetyl acetonate, which emit light having a wavelength in a range of from about 420 nanometers to about 433 nanometers. Other suitable electroluminiscent materials that emit in the visible wavelength range may include organo-metallic complexes of 8-hydroxyquinoline, such as tris-8-quinolinolato aluminum and its derivatives.

The OLED may further include one or more layers such as a charge transport layer, a hole transport layer, a hole injection layer, a hole injection enhancement layer, an electron transport layer, an electron injection layer and an electron injection enhancement layer or any combinations thereof. The OLED may further include a light transmissive substrate layer.

Non-limiting examples of materials suitable for use as charge transport layers may include low-to-intermediate molecular weight organic polymers for example, organic polymers having weight average molecular weights $M_w$ of less than about 200,000 grams per mole as determined using polystyrene standards for example, poly-3,4-ethylene dioxy thiophene (PEDOT), polyaniline, poly-3,4-propylene dioxythiophene (PProDOT), polystyrene sulfonate (PSS), polyvinyl carbazole (PVK), and other like materials.

Non-limiting examples of materials suitable for the hole transport layer may include triaryldiamines, tetraphenyldiamines, aromatic tertiary amines, hydrazone derivatives, carbazole derivatives, triazole derivatives, imidazole derivatives, oxadiazole derivatives including an amino group, polythiophenes, and like materials. Non-limiting examples of materials suitable for a hole-blocking layer may include poly N-vinyl carbazole, and like materials.

Non-limiting examples of materials suitable for a hole-injection layers may include "p-doped" proton-doped conducting polymers, such as proton-doped polythiophene or polyaniline, and p-doped organic semiconductors, such as tetrafluorotetracyanoquinodimethane (F4-TCQN), doped organic and polymeric semiconductors, and triarylamine-containing compounds and polymers. Non-limiting examples of electron-injection materials may include polyfluorene and its derivatives, aluminum tris-8-hydroxyquinoline (Alq3), organic/polymeric semiconductors n-doped with alkali alkaline earth metals, and the like.

Non-limiting examples of materials suitable for a hole injection enhancement layer may include arylene-based compounds such as 3,4,9,10-perylene tetra-carboxylic dianhydride, bis-1,2,5-thiadiazolo-p-quino bis-1,3-dithiole, and like materials.

Non-limiting examples of materials suitable for the electron injection enhancement layer materials and electron transport layer materials may include metal organic complexes such as oxadiazole derivatives, perylene derivatives, pyridine derivatives, pyrimidine derivatives, quinoline derivatives, quinoxaline derivatives, diphenylquinone derivatives, nitro-substituted fluorene derivatives, and like materials.

In one embodiment, the light transmissive controller may include a transparent thin film transistor. A thin film transistor TFT is an active device, which is the building block for electronic circuits that switch and amplify electronic signals. Attractive TFT device characteristics include a low voltage to turn it on, a high transconductance or device current to gate control-voltage ratio Vg, and a high 'on' Vg greater than 0 current to 'off' Vg less than or equal to 0 current ratio. The TFT may be fabricated in such a manner that materials used in the different elements of the TFT, such as a source electrode, a drain electrode, a gate electrode, a gate dielectric and a substrate, should result in a transparent TFT.

The substrate can be used as a support during the manufacturing, testing, and/or use of the TFTs. The substrate used is similar to the light transmissive element as discussed above. Depending on the method of making the transistor, the substrate may be an optional element. In one embodiment, the support does not provide any necessary electrical function for the TFT and hence functions as an insulator. Suitable substrate materials may include organic or inorganic materials and may be rigid or flexible. Non-limiting examples of substrates include inorganic glasses, ceramic foils, polymeric materials, filled polymeric materials, coated metallic foils, acrylics, epoxies, polyamides, polycarbonates, polyimides, polyketones, polyoxy-1,4-phenyleneoxy-1,4-phenylenecarbonyl-1,4-phenylene sometimes referred to as polyether ether ketone or (PEEK), polynorbornenes, polyphenyleneoxides, polyethylene naphthalenedicarboxylate (PEN), polyethylene terephthalate (PET), polyether sulfone (PES), polyphenylene sulfide (PPS), and fiber-reinforced plastics (FRP). In one embodiment the substrates may be flexible. Flexible substrates can also be thin metal foils such as stainless steel provided they are coated with an insulating layer to electrically isolate the thin film transistor.

A variety of conductive materials known in the art may be used as the gate electrode. Suitable conductive materials include doped silicon, or a metal, such as aluminum, chromium, gold, silver, nickel, copper, tungsten, palladium, platinum, tantalum, and titanium, transparent conductors such as indium-tin oxide (ITO), zinc oxide, tin II oxide, or lanthanum III dioxide; conductive polymers such as polyaniline, poly 3,4-ethylene dioxythiophene and polystyrene sulfonate (PEDOT:PSS). In addition, alloys, combinations, and multilayers of these materials may be useful. In some embodiments, the same material can provide the gate electrode function and also provide the support function of the substrate. For example, doped silicon can function as the gate electrode and the substrate for TFT. In one embodiment, the thickness of the gate electrode may be such that the gate electrode does not hinder or reduce the efficiency of light transmitted through the device.

In a TFT, the gate dielectric contacts the gate electrode. This gate dielectric electrically insulates the gate electrode from the balance of the TFT device. Thus, the gate dielectric includes an electrically insulating material. The gate dielectric should have a suitable dielectric constant that can vary widely depending on the particular device and circumstance of use. For example, a dielectric constant of from about 2 to about 100 may be available as a gate dielectric. Suitable materials that may be used for the gate dielectric may include one or more strontiates, tantalates, titanates, zirconates, aluminum oxides, silicon oxides, tantalumoxides, titanium oxides, silicon nitrides, barium titanate, barium strontium titanate, barium zirconate titanate, zinc selenide, or zinc sulfide. In addition, alloys, combinations, and multilayers of the foregoing; polymeric materials such as polyimides, polyvinyl alcohol, poly-4-vinylphenol, polyimide, and polyvinylidene fluoride, polystyrene and substituted derivatives thereof, polyvinyl naphthalene and substituted derivatives, and polymethyl methacrylate. In one embodiment, the thickness of the gate dielectric is such that the gate dielectric does not hinder or reduce the efficiency of light transmitted through the device.

Source/drain electrodes refer to the terminals of a TFT, between which conduction occurs under the influence of an electric field. The source electrode and drain electrode are separated from the gate electrode by at least the gate dielectric, while the conducting channel can be over or under the source electrode and drain electrode. The source and drain electrodes can be any useful conductive material. Suitable materials include most of those materials described above for the gate electrode, for example, aluminum, barium, calcium, chromium, gold, silver, nickel, palladium, platinum, titanium, copper, tungsten, polyaniline, conducting polymers, alloys thereof, combinations thereof, multilayers thereof; transparent, n-type conductors such as indium-tin oxide (ITO), oxides of zinc, tin and lanthanum. In one embodiment, the thickness of the source/drain electrodes may be such that the source/drain electrodes do not hinder or reduce the efficiency of light transmitted through the device.

In one embodiment, the material employed in the conducting channel of the thin film transistor may be a zinc oxide-based semiconductor thin film transistor employing zinc-oxide-based nanoparticles. In one embodiment, the zinc-oxide-based semiconductor materials are "n-type," although, through the use of suitable dopants, p-type materials are also envisioned. The zinc-oxide-based semiconductor material can contain other metals capable of forming semiconducting oxides such as indium, tin, or cadmium, and combinations thereof. Minor amounts of acceptor dopants can also be included. Semiconductor films described above are capable of exhibiting, in the film form, excellent field-effect electron mobility of greater than 0.01 square centimeter/Volts-Second and on-off ratios of greater than $10^4$, enabling their use in a variety of relevant technologies, including active matrix display backplanes.

Other suitable materials having specific thickness that may be employed in the conducting channel of the thin film transistor. Suitable materials may include metals like Al, Ag, Au, Ba, Ca, In, K, Li, Mg, Mn, Na, Pb, Sr, Sn, Sc, Y, Zn, and Zr. Other suitable materials may include elements of the lanthanide series. Suitable relatively low work function value alloys may include Ag—Mg alloy, Al—Li alloy, In—Mg alloy, Al—Ca alloy, Li—Al alloy, and Ca—Ga alloy. These low work function value cathode materials may be present in the metallic form or as a n-type dopant dispersed in an organic matrix. Other examples may include alkali metal fluorides or alkaline earth fluorides. Other suitable materials may include metal oxides, such as indium-tin oxide, tin oxide, indium oxide, zinc oxide, indium-zinc oxide, zinc indium-tin oxide, and transition metal oxides such as vanadium oxide ($V_2O_5$), molybdenum oxide ($Mo_2O_3$), and antimony oxide ($Sb_2O_3$). In one embodiment, an organic suitable cathode may be fashioned from carbon nanotubes. The cathode can be made of multiple layers to enhance electron injection. Non-limiting examples of multi-layer cathodes may include an inner layer of either LiF or NaF with an outer layer of aluminum or silver; and an inner layer of calcium with by an outer layer of aluminum or silver. In one embodiment, the thickness of the conducting channel may such that the conducting channel does not hinder or reduce the efficiency of light transmitted through the device.

Referring to FIG. 1, a device 2 includes a light transmissive controller 4 and a first light transmissive organic electronic device 6. Both secure to a first light transmissive element 8 to form a first layer 10 of the device. A second light transmissive element 12 is disposed over the first layer of the device, and a second light transmissive organic electronic device 14 is secured to the second light transmissive element to form a second layer 16. The light transmissive controller connects to both the first light transmissive organic electronic device and the second light transmissive organic electronic device. The light transmissive controller can control the first light transmissive organic electronic device and the second light transmissive organic electronic device by varying an applied voltage bias 18 and 20, respectively.

Figure 2:
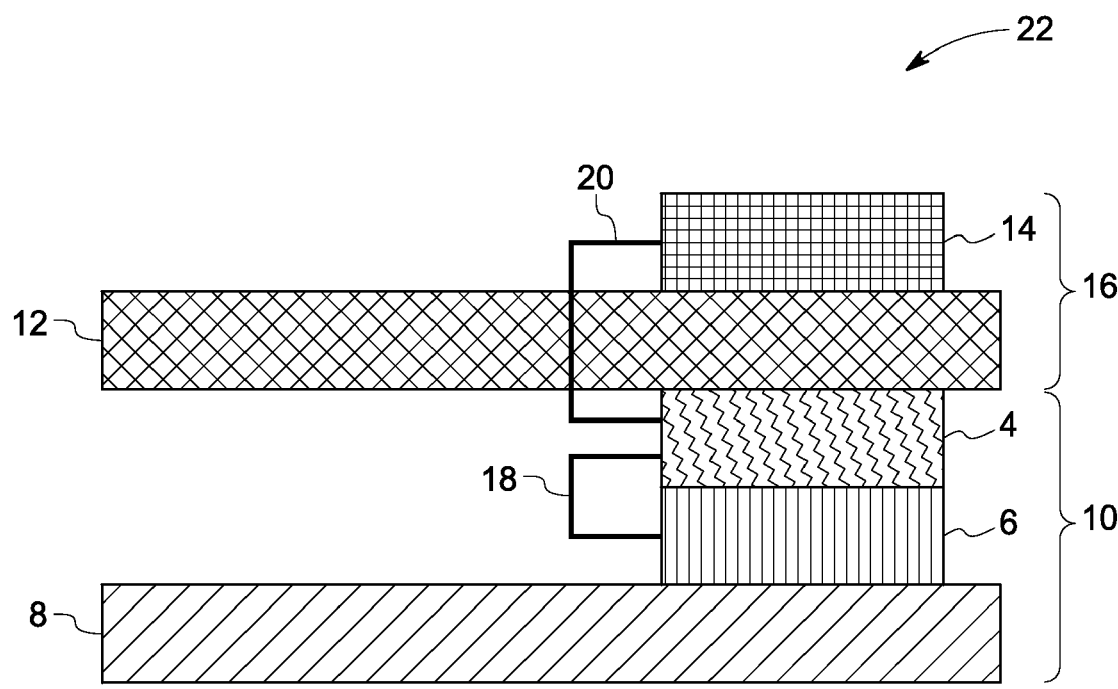
FIG. 2 is a schematic representation of an embodiment of a device according to the invention.
Figure 3:
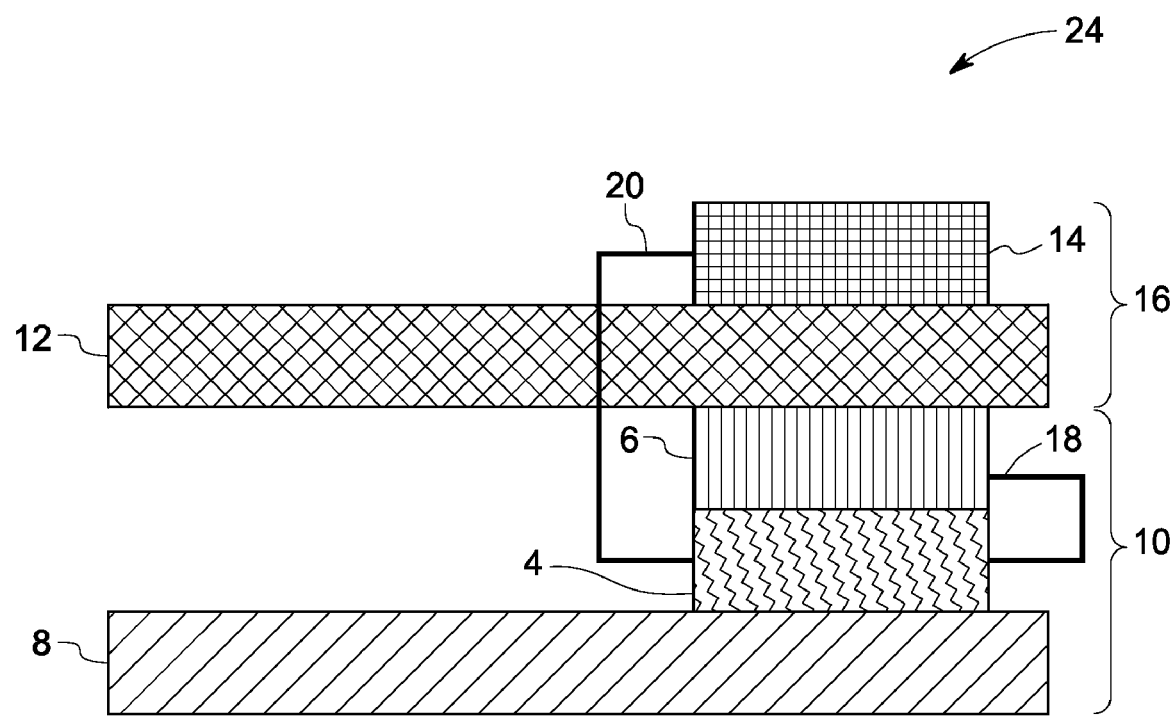
FIG. 3 is a schematic representation of an embodiment of a device according to the invention.

Various arrangements may be possible for the different elements included in FIG. 1. A device 22 (FIG. 2) and device 24 (FIG. 3) each have the same description as provided above for the device 2. One difference lies in the arrangement of the elements. In FIG. 2, the first light transmissive organic electronic device secures directly to the surface of the first light transmissive element, and the light transmissive controller secures to an outward facing surface of the first light transmissive organic electronic device (which is sandwiched therebetween). In FIG. 3, the light transmissive controller secures directly to the surface of the first light transmissive element, and the first light transmissive organic electronic device secures to the outward facing surface of the light transmissive controller.

Figure 4:
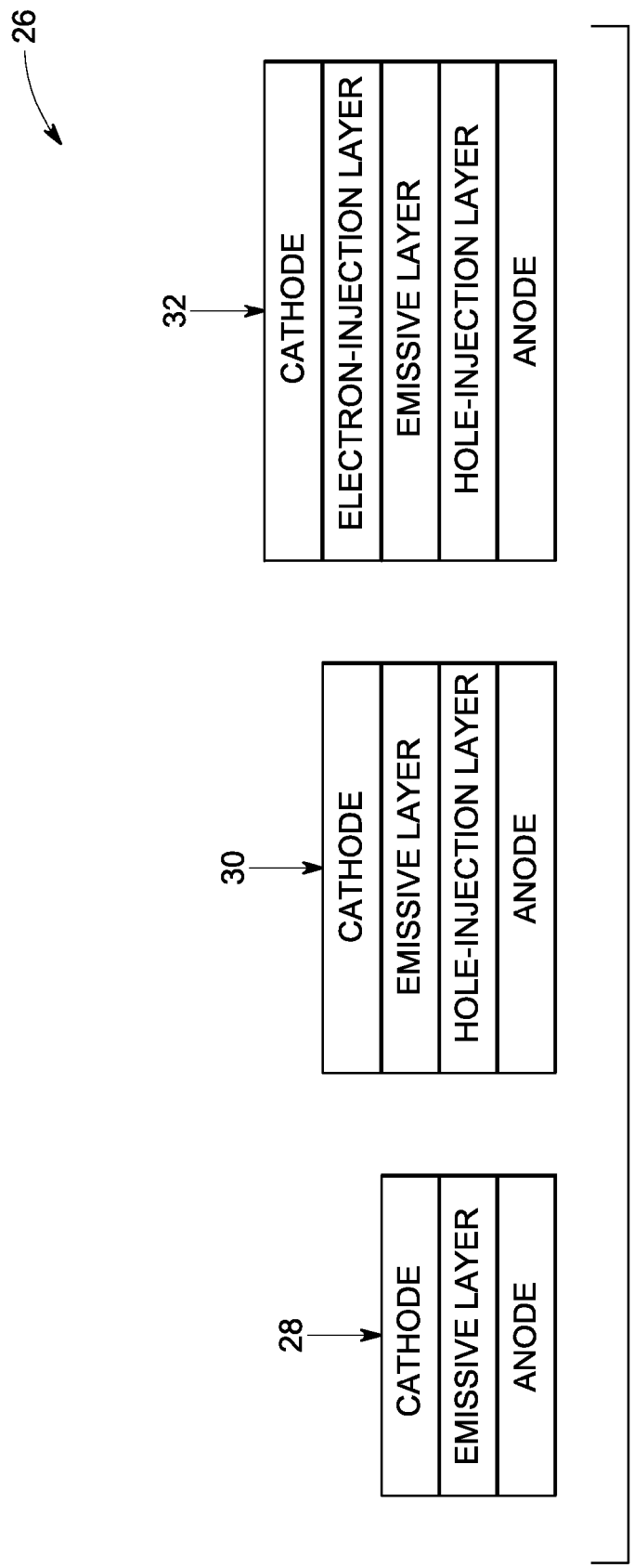
FIG. 4 is a representation of exemplary OLED structures.

As shown in FIG. 4, the OLEDs 26 can be sandwiched between a first electrode anode and a second electrode cathode in each of the exemplary embodiments indicated by reference numbers 28, 30 and 32. Further, the first electrode and the second electrode each are operably coupled to at least one tunable voltage source. A single layer configuration OLED is indicated by reference number 28 and has the single layer organic semiconductor that provides efficient hole injection/transport, emission, electron injection/transport functions. A bi-layer configuration is indicated by reference number 30 and has a separate layer, in addition to the emitting layer, that serves as a hole injection or electron injection layer. A tri-layer configuration is indicated by reference number 32 and includes a separate hole-injection layer and a separate electron-injection layer, in addition to the emissive layer. For each configuration, one or more additional layers may be present to provide charge blocking or confinement functions, if needed.

Figure 5:
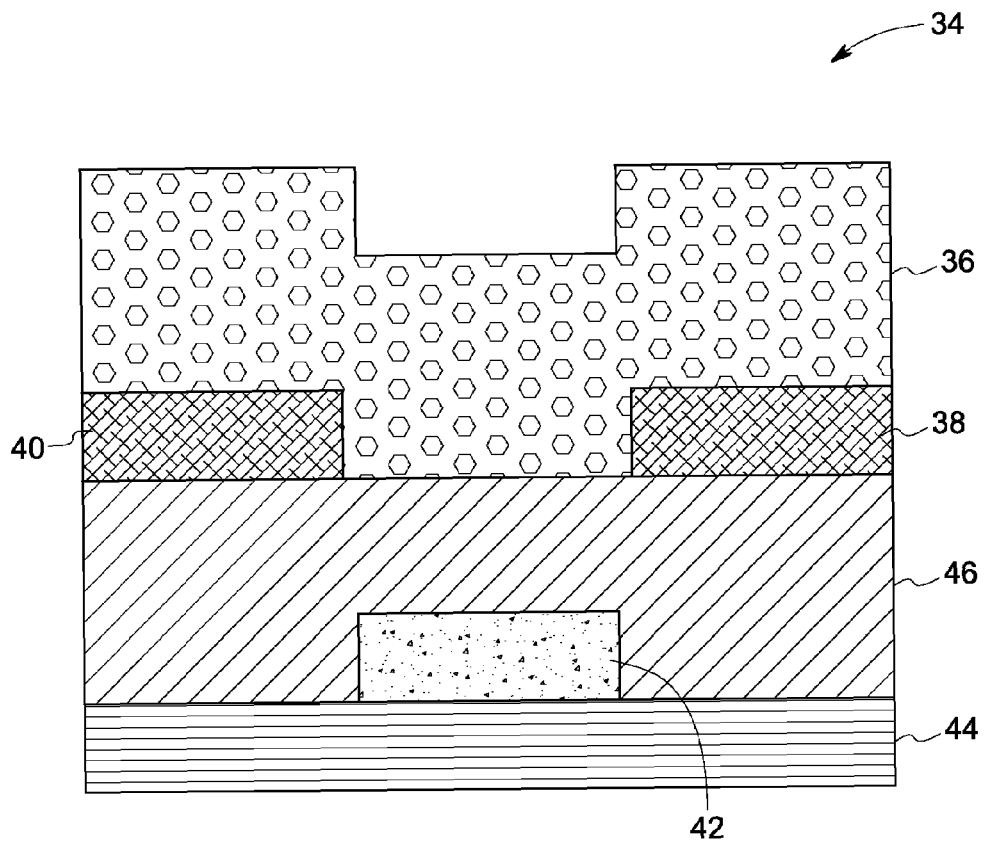
FIG. 5 is a cross-sectional view of a thin film transistor having a bottom-gate/bottom-contact configuration.
Figure 6:
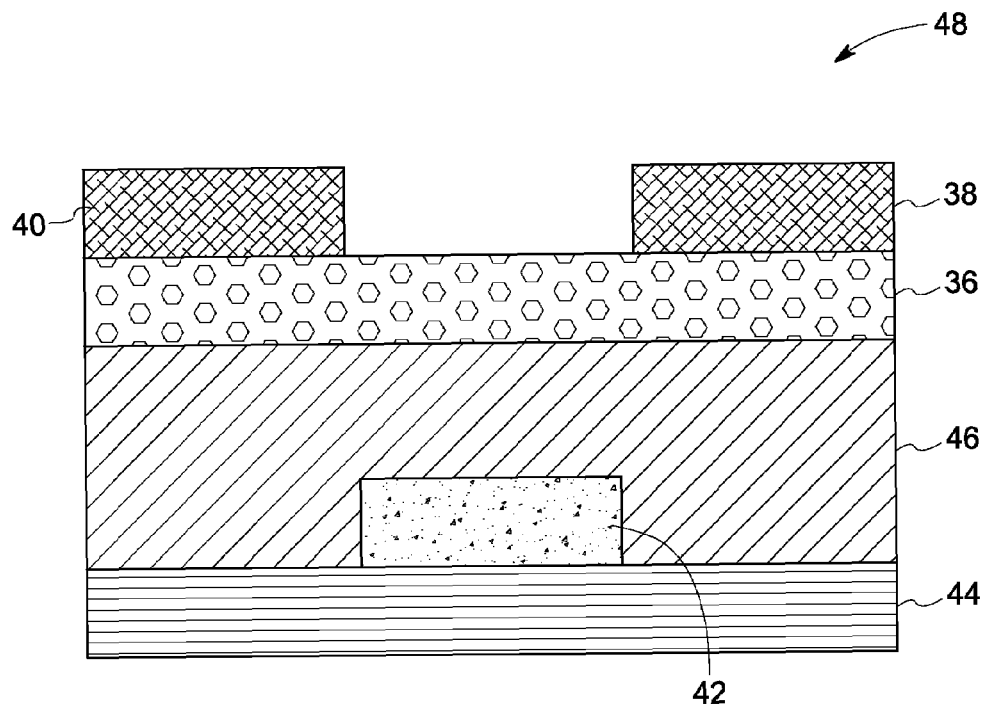
FIG. 6 is a cross-sectional view of a thin film transistor having a bottom-gate/top-contact configuration.

Referring to FIGS. 5 and 6, the thin film transistor devices 34 and 48, include a source electrode 38, a drain electrode 40, a gate electrode 42, a gate dielectric 46, a substrate 44, and the conducting channel 36 used in the invention in the form of a film connecting the source electrode to drain electrode. When the TFT operates in an enhancement-mode, the charges injected from the source electrode into the semiconductor are mobile and a current flows from source to drain electrode, mainly in a thin channel region within 100 Angstroms of the conduction channel-gate dielectric interface. In the configuration of FIG. 5, the charge may be injected laterally from the source electrode to form the conducting channel. In the absence of a gate field the conducting channel has few charge carriers; as a result there is ideally no source-drain conduction when the device is in off mode. The off current is defined as the current flowing between the source electrode and the drain electrode when charge has not been intentionally injected into the conducting channel by the application of a gate voltage. This occurs for a gate-source voltage that is more negative, assuming an n-channel, than a certain voltage known as the threshold voltage. The on current is defined as the current flowing between the source electrode and the drain electrode when charge carriers have been accumulated intentionally in the channel by application of an appropriate voltage to the gate electrode, and the conducting channel is conducting. For an n-channel accumulation-mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode across the gate dielectric to the conducting channel-gate dielectric interface, effectively charging a capacitor.

Figure 7:
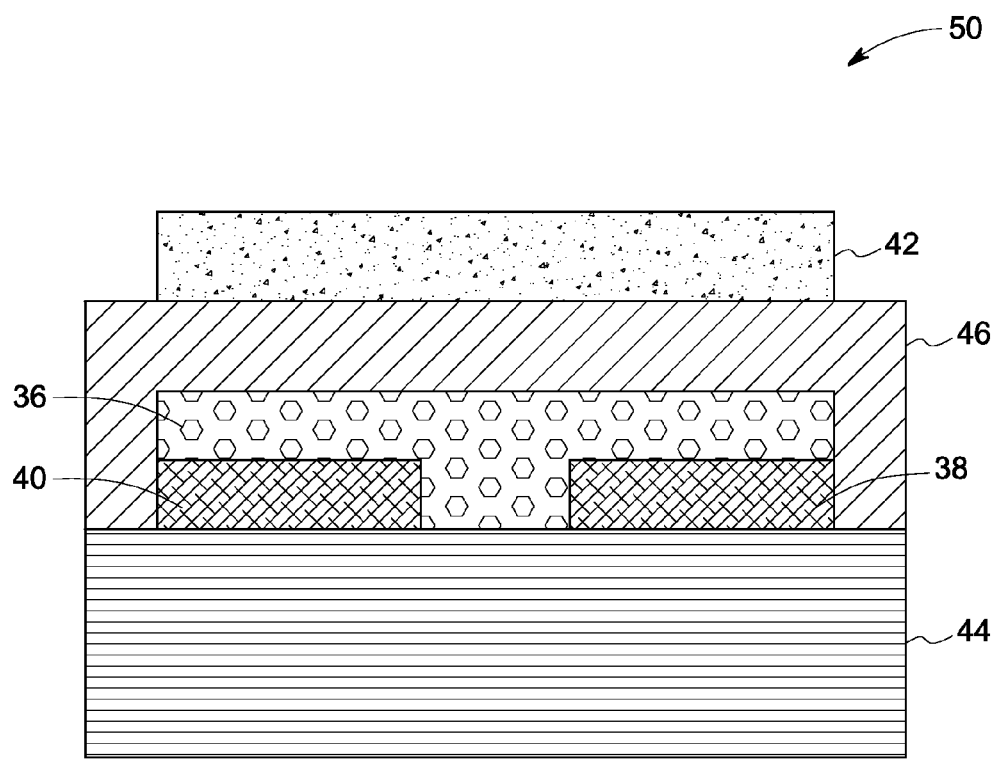
FIG. 7 is a cross-sectional view of a thin film transistor having a top-gate/bottom-contact structure.

Referring to FIG. 7, the thin film transistor device 50, includes an insulating substrate 44 upon which is disposed a source electrode 38 and a drain electrode 40. A conducting channel 36 is provided such that contact between the source and drain electrodes is made. A gate electrode 42 is disposed on the top surface from a vertical perspective of the gate dielectric 46. In other words, the gate electrode and the conducting channel are provided on opposing surfaces of the gate dielectric.

Figure 8:
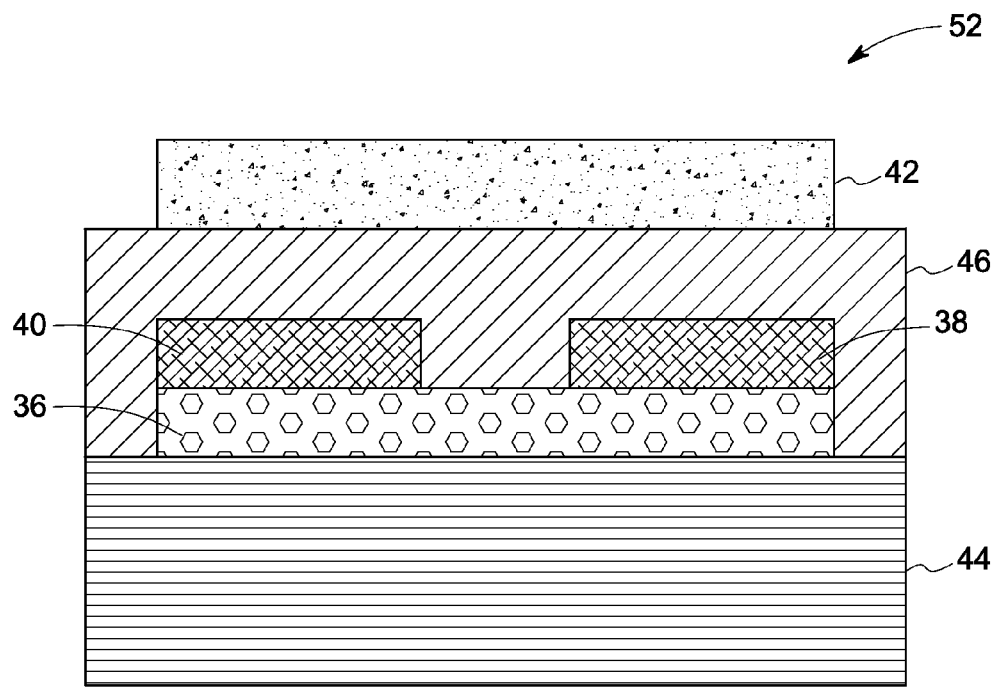
FIG. 8 is a cross-sectional view of a thin film transistor having a top-gate/top-contact structure.

Referring to FIG. 8, the thin film transistor device 52, includes an insulating substrate 44 upon which is disposed a conducting channel 36. A source electrode 38 and a drain electrode 40 are disposed on a surface of the conducting channel that is adjacent to the substrate. A gate electrode 42 is disposed on the top surface from a vertical perspective of the gate dielectric 46. In other words, the gate electrode and the conducting channel are provided on opposing surfaces of the gate dielectric.

A device is provided in one embodiment of the invention. The device includes a light transmissive element, a color-tunable light-emitting device, and a light transmissive controller. The color-tunable light-emitting device, the light transmissive controller, and the light transmissive element are secured to each other.

In one embodiment, the color-tunable light-emitting device may include a first light-emitting element, a second light-emitting element, an active light transformative element and at least one light transmissive element, wherein the first light-emitting element and the second light-emitting element emit light at differing wavelengths. In one embodiment, the color-tunable light-emitting device may include at least one passive light transformative element. In one embodiment, color-tunable light-emitting device may be a light transmissive device.

The first light-emitting element and the second light-emitting element may include an OLED. The OLED used may be the same as or similar to those described above. The active light transformative element may include at least one element chosen from the group of electrochromic elements, photochromic elements, and thermochromic elements. The active light transformative element may be disposed between the first light-emitting element and the second light-emitting element. In certain embodiments, a combination of the electrochromic element and/or photochromic element and/or thermochromic element may be used in color-tunable light-emitting device to modulate the light emitted from the device. The transmission of the electrochromic element can be varied by varying an applied bias. The perceived color of the light emerging from the device is thus a combination of the light emerging directly from the color-tunable light-emitting device and the light modulated by the electrochromic element. In one embodiment the electrochromic element can be replaced with a photochromic element. When a photochromic element is used, the photochromic element can be tuned by coupling with a light tunable source. In one embodiment, the electrochromic element can be replaced with a thermochromic element. When a thermochromic element is used the thermochromic element can be tuned by coupling with a temperature tunable source.

As used herein, electrochromic elements, photochromic elements, and thermochromic elements present in various embodiments of the color-tunable light-emitting devices are defined to be "active" light transformative elements and are distinct from passive light transformative elements such as phosphors and color filters. Active light transformative elements modulate light passing through them in response to and as a function of an applied bias. In the case of electrochromic elements, the bias results from the application of a voltage differential within the electrochromic element. In the case of photochromic elements, the bias can result from the irradiation of the photochromic element with a source of light, i.e., by using an external tunable light source. In the case of a thermochromic element, the bias can result from the application of heat to, or the removal of heat from the thermochromic element. This may be accomplished by using a temperature tunable source for the thermochromic element. In each case the bias may be applied to a lesser or greater extent so that the color emerging from the active light transformative element is tunable thereby. Applying bias to a lesser or greater extent is tuning.

In one embodiment, the light emerging from the color-tunable light-emitting device may be modulated by the application of a determined bias, for example a specific voltage differential applied to an electrochromic element within a color-tunable light-emitting device. In other instances, the bias is provided by the environment. For example, in the case of a photochromic element, the color emerging from a color-tunable light-emitting device may be modulated by intentional changes in the level of ambient light or by an unintended change in the level of ambient light. An example of an intended change in the level of ambient light that may be given is the change in the level of ambient light that occurs as a theater or aircraft cabin is intentionally darkened. An example of an unintended change in the level of ambient light that may be given is the change in the level of ambient light that occurs as a dark cloud obscures the sun, or for that matter the change in the level of ambient light occasioned by the setting of the sun, a change anticipated though not necessarily intended. Similarly, in case of the thermochromic element, the change in color can be a result of an intentional change in temperature or may be a response to an unintended change in temperature. Such color-tunable light-emitting devices may be used as a temperature indicator, signaling by a change in color whether something in thermal contact with the thermochromic element of the color-tunable light-emitting device is cold, warm, or hot.

Examples of suitable electrochromic elements may include inorganic metal oxides, most transition metal oxides (e.g., $WO_3$, $V_2O_5$, and the like), electroconductive polymers, and the like. Suitable electroconductive polymers may include unsubstituted and substituted polyaniline, polythiophene and polypyrrole. Examples of suitable electrode materials for use in the electrochromic elements are transparent metal oxides, such as ITO, fluorine doped $SnO_2$, and the like; semi-transparent thin metals such as gold; and conducting polymers, such as poly-3,4-ethylenedioxythiophene/polystyrene sulfonate (PEDOT/PSS), and like materials. In one embodiment, ion conductors and electrolytes may be employed as components of the electrochromic element in the color-tunable light-emitting device. Examples of suitable ion conductors and electrolytes include liquid electrolyte solutions, such as lithium perchlorate in propylene carbonate, and ionic liquids; gel electrolytes including a polymeric material e.g., polyvinyl butyral, polyethylene oxide, polymethyl methacrylate, and polyethylene glycol, a lithium salt, and a solvent, and solid polymeric electrolytes. Suitable lithium salts may include $LiClO_4$, $LiCF_3SO_3$, LiCl, and $LiPF_6$. Suitable solvents may include one or more of propylene carbonate, acetonitrile, ethylene carbonate, and the like. Suitable solid polymeric electrolytes may include cured or crosslinked polyacrylates, polyurethanes, and the like.

Figure 9:
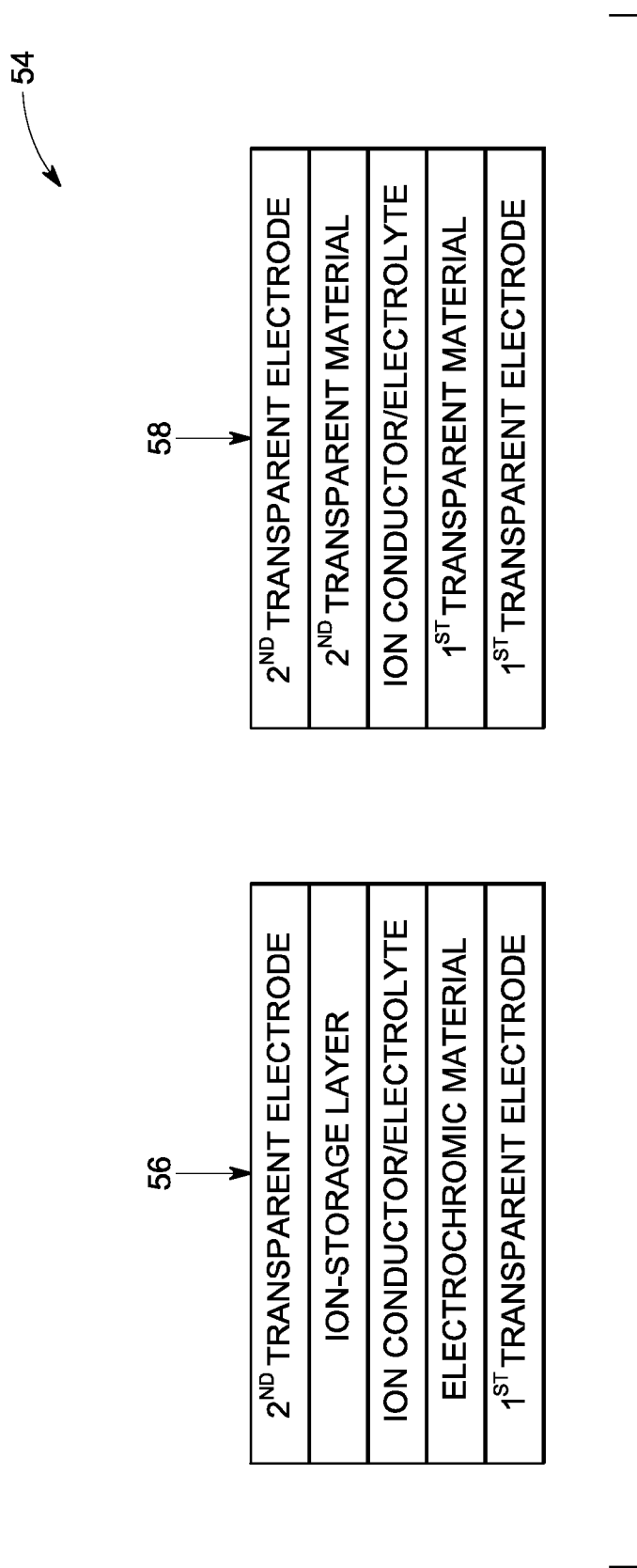
FIG. 9 is a schematic representation of exemplary electrochromic elements.

Electrochromic elements 54 are at times herein referred to as electrochromic devices, "ECDs". Exemplary ECDs 56 and 58 are shown in FIG. 9. The ECDs may be "inorganic" ECDs or "organic" ECDs. In one embodiment, ITO is used as a first transparent electrode, onto which an electrochromic material including a transition metal oxide, such as $WO_3$, an ion conductor layer such as $MgF_2$, or an electrolyte, an ion-storage layer such as $V_2O_5$ and a second transparent electrode for example a thin metal layer, an ITO layer, or like material are sequentially deposited. In one embodiment, the change in color and/or transmittance may be controlled by the choice of the electrochromic material employed.

In one embodiment, ITO is used as the bottom transparent electrode, onto which a first organic electrochromic material such as polythiophene and its derivatives, an ion conductor layer such as an electrolyte, a second complementary electrochromic material, such as polyaniline, and another transparent top electrode for example a thin metal layer, an ITO layer, or like material are sequentially deposited. Alternatively, the device assembly can be fabricated by lamination. Lamination may include forming the device assembly by laminating a first component including a substrate, a first transparent conductor for example an ITO layer, an F doped $SnO_2$ layer, or like material, a first polymeric electrochromic material, a preformed sheet of electrolyte dispersed in a polymer matrix, and a second component including a second electrochromic material, an inorganic ion-storage layer, and a substrate. The change in color and/or transmittance may be controlled by the choice of electrochromic material employed Inorganic-organic hybrid ECD device assembly can be formed by joining a first component including substrate, a first transparent electrode for example an ITO layer, an F doped $SnO_2$ layer, or like material, a polymeric electrochromic material for example polythiophene, and a gel electrolyte for example lithium triflate dispersed in a polymer matrix, with a second component including an inorganic ion-storage layer such as $TiO_2$, a second transparent electrode, and a substrate. The change in color and/or transmittance may be controlled by the choice of the electrochromic material employed.

Suitable photochromic materials include asymmetric photochromic compounds. A photochromic protein may be employed as a photochromic element in the color-tunable light-emitting device. Pyran derivatives may be used as photochromic material in the photochromic element. Suitable pyran derivatives may include 3,4-diphenylaminophenyl-1-3-2-fluorophenyl-3H-naphtho(2,1-b)pyran; 3,4-dimethyl aminophenyl-3,2-fluorophenyl-3H-naphtho(2,1-b)pyran; 3,2-fluorophenyl-3-(4-N-morpholinylphenyl)-3H-naphtho (2,1-b)pyran; 3,2-fluorophenyl-3-(4-N-piperidinylphenyl)-3H-naphtho(2,1-b)pyran; 3-4-dimethyl aminophenyl-6-N-morpholinyl-3-phenyl-3H-naphtho(2,1-b)pyran; 6-N-morpholinyl-3-(4-N-morpholinylphenyl)-3-phenyl-3H-naphtho(2,1-b)pyran; 6-N-morpholinyl-3-phenyl-3-(4-N-piperidinyl phenyl)-3H-naphtho(2,1-b)pyran; and 6-N-morpholinyl-3-phenyl-3-(4-N-pyrrolidinylphenyl)-3H-naphtho(2,1-b)pyran; and mixtures of two or more of the foregoing. Other suitable photochromic materials may include photochromic indeno(2,1-f)naphtho(1,2-b)pyrans and spiro-9-fluoreno(1,2-b)pyrans. In one embodiment, the photochromic element includes a cured photochromic polymerizable composition.

In one embodiment, photochromic 2H-naphtha(1,2-b)pyran compounds that impart grey color may be used in preparing the photochromic element. In an alternate embodiment, one or more spiropyran salt compounds may serve as a component of the photochromic element. Other classes of compounds which may serve as a component of the photochromic elements are exemplified by azobenzene compounds, thioindigo compounds, dithizone metal complexes, spiropyran compounds, spirooxazine compounds, fulgide compounds, dihydropyrene compounds, spirothiopyran compounds, 1,4-2H-oxazine compounds, triphenylmethane compounds, viologen compounds, naphthopyran compounds, and benzopyran compounds.

In one embodiment, the photochromic material is used without additional adjuvants. In an alternate embodiment, the color changing function and/or the fastness to light may be enhanced by combining the photochromic material with an adjuvant also referred to herein as an auxiliary agent such as one or more high-boiling solvents, plasticizers, synthetic resins, hindered amines, hindered phenols, and the like. These compounds are well known additives for use in combination with photochromic materials and their proportions can be selected from the known ranges. Suitable examples of hindered phenol compounds include, among others, 2,6-di-t-butylphenol, 2,4,6-tri-t-butylphenol, 2,6-di-t-butyl-p-cresol, 4-hydroxymethyl-2,6-di-t-butylphenol, 2,5-di-t-butylhydroquinone, 2,2'-methylene-4-ethyl-6-t-butylphenol, and 4,4'-butylidene-bis3-methyl-6-t-butylphenol. Suitable examples of the hindered amine compounds include, among others, bis-2,2,6,6-tetramethyl-4-piperidinylsebacate; bis-1,2,2,6,6-pentamethyl-4-piperidinylsebacate; the polycondensate of dimethylsuccinate and 1-2-hydroxyethyl-4-hydroxyl-2,2,6,6-tetramethyl piperidine; bis-1,2,2,6,6-pentamethyl-4-piperidinyl-2,3,5-di-t-butyl-4-hydroxybenzyl-2-n-butylmalonate; 1-(2-3-3,5-di-t-butyl-4-hydroxyl phenyl propionyloxy ethyl)-4-3-3,5-di-t-butyl-4-hydroxyl phenyl-propionyloxy-2,2,6,6-tetramethyl piperidine; 8-benzyl-7,7,9,9-tetramethyl-3-octyl-1,3,8-triazaspiro(4.5)undecane-2,4-di one; and tetrakis-2,2,6,6-tetramethyl-4-piperidinebutane carbonate. Other suitable hindered amine compounds are commercially available as MARK LA57, MARK LA62 and MARK LA67 all the trademarks of Adeka-Argus Chemical Co., Ltd. (Tokyo, Japan).

Suitable thermochromic materials may contain an acid-responsive chromogenic substance and an acidic substance. Suitable acid-responsive chromogenic substances may include triphenylmethanephthalide compounds, phthalide compounds, phthalan compounds, acyl-leucomethylene blue compounds, fluoran compounds, triphenylmethane compounds, diphenylmethane compounds, spiropyran compounds, and the like. Other suitable acid-responsive chromogeneic substances include 3,6-dimethoxyfluoran; 3,6-dibutoxyfluoran; 3-diethylamino-6,8-dimethylfluoran; 3-chloro-6-phenylaminofluoran; 3-diethylamino-6-methyl-7-chlorofluoran; 3-diethylamino-7,8-benzofluoran; 2-anilino-3-methyl-6-diethylaminofluoran; 3,3',3"-trispdimethyl amino phenylphthalide, 3,3'-bis p-dimethyl amino phenyl phthalide; 3-diethylamino-7-phenyl amino fluoran; 3,3-bis p-diethylaminophenyl-6-dimethyl amino phthalide; 3,4-diethylamino phenyl-3,1-ethyl-2-methylindol-3-ylphthalide; 3,4-diethylamino-2-methylphenyl-3,1,2-dimethylindol-3-ylphthalide; and 2',2-chloroanilino-6'-dibutylamino spiro phthalido-3,9'-xanthene. Suitable acidic substances include 1,2,3-benzotriazole compounds, phenol compounds, thiourea compounds, oxo-aromatic carboxylic acids, and the like. Specific examples of acidic compounds include 5-butylbenzotriazole; bis benzotriazole-5-methane; phenol; nonylphenol; bisphenol A; bisphenol F; 2,2'-biphenol; beta-naphthol; 1,5-dihydroxynaphthalene; alkyl p-hydroxybenzoates, phenol resin oligomer, and the like. The thermochromic materials may be used with a solvent. The use of a solvent may render the material responsive to change in temperature with greater sensitivity and definition. Suitable solvents may include alcohols; alcohol-acrylonitrile adducts; azomethine compounds; esters; and the like. Among specific examples of the solvent are decyl alcohol; lauryl alcohol; myristyl alcohol; cetyl alcohol; stearyl alcohol; behenyl alcohol; lauryl alcohol-acrylonitrile adduct; myristyl alcohol-acrylonitrile adduct; stearyl alcohol-acrylonitrile adduct; benzylidene-p-toluidine; benzylidene-butylamine; octyl caprate; decyl caprate; myristyl caprylate; decyl laurate; lauryl laurate; myristyl laurate; decyl myristate; lauryl myristate; cetyl myristate; lauryl palmitate; cetyl palmitate; stearyl palmitate; cetyl p-t-butylbenzoate; stearyl 4-methoxybenzoate; dilauryl thiodipropionate; dimyristyl thiodipropionate; stearyl benzoate; benzyl stearate; dibenzyl thiodipropionate; distearyl thiodipropionate; benzyl benzoate; and glycerol trilaurate.

Intrinsically thermochromic materials may be used in the thermochromic element in the color-tunable light-emitting device. Intrinsically thermochromic materials include chromophores that are chemically altered on heating without the need for an external reagent, and which change color in the process. Thermochromic colors including Fast Yellow Gold Orange, Vermillion, Brilliant Rose, Pink, Magenta, Fast Blue, Artic Blue, Brilliant Green, Fast Black, Green Brown and mixtures of the foregoing may be used in the thermochromic element. Rylene dyes may be employed in the thermochromic element. Another exemplary thermochromic material includes a colorless electron donating color-former capable of forming color upon reacting with an electron accepting acid compound and an aromatic hydroxy ester. A thermochromic material exhibiting a sharp and reversible metachromation at temperatures within a range of from about −40 degrees Celsius to about 80 degrees Celsius, formed from an electron donating chromatic organic compound, a compound containing a phenolic hydroxyl group, a compound selected from the group consisting of higher aliphatic monovalent alcohols and a compound selected from the group consisting of higher aliphatic monovalent acid alcohol esters can also be used as the thermochromic element.

Reversible thermochromic pigments that change color in the presence of diaminoalkane activators may be used as the thermochromic element. Suitable dyes that can be employed in making the pigments include 6-dimethylamino-3,3-bis-dimethyl aminopheny-1,1,3-H-isobenzofuranone crystal violet lactone; 2'-anilino-6-diethylamino-3-methylfluoran; 2'-dibenzylamino-6'-diethylaminofluoran; 3,3-bis-1-butyl-2-methyl-1-H-indol-3-yl-1,3-H-isobenzofuranone; 3,4-dimethyl aminophenyl-3-(N,N'-bis-4-octylphenyl aminophthalide; 2,4,8,10-tetraiodo-3,9-dihydroxy-6-3',4',5',6'-tetrachlorophenyl-2-phthalidoxanthenone Rose Bengal lactone; 3,3-bis-4'-hydroxyl-3'-methyl-5'-dicarboxy methylamino methylphenyl isobenzofuran-3-one o-cresol phthalein complexone; 3,3-bis sodium-3'-sulfonato-4'-hydroxyphenyl-4,5,6,7-tetrabromo isobenzofuran-3-one sulfobromo naphthalein sodium salt; 3,3-bis-3',5'-dibromo-4-hydroxyl phenyl isobenzofuran-3-one tetrabromo phenol phthalein bromocresol green thymol phthalein. These pigments may be used in thermochromic elements capable of modulating an exceptionally wide range of color inputs, thereby providing even greater color control of the light output from the color-tunable light-emitting devices.

Other reversible thermochromic materials may include an electron donor color-former; a sulfide, sulfoxide or sulfone containing a hydroxy phenyl group; and a chemical compound selected from alcohols, esters, ethers, ketones, carboxylic acids or acid amides, that chromatizes very brightly and in a dense color, generating a change of chromic hue colored—colorless within a narrow temperature range and providing a stable thermochromatism on a long term basis can also be employed in the thermochromic element. Alternately, a reversible thermochromic composition containing a diazarhodamine lactone derivative as an electron-donating color-developing organic compound, an electron-accepting compound, and a reaction medium for causing a reversible electron exchange reaction between the components in a specified temperature range may be used. This reversible thermochromic composition develops clear reddish color in its colored state, and becomes colorless in its colorless state, and is remarkably free of residual color. Still other reversible thermochromic compounds include bridged phthalides and sulfinate esters.

Additional thermochromic compositions known in the art can also be employed in the thermochromic element of the color-tunable light-emitting devices. In one instance, the thermochromic composition includes an electron donating chromogeneic organic compound, an electron accepting compound and at least one desensitizer selected from among diphenylamine derivatives and at least one desensitizer selected from among carbazole derivatives. Another example of a thermochromic composition includes a colorant in a binder and an activator that causes the thermochromic colorant to change color at a temperature first than the temperature at which the colorant would undergo a color change in the absence of the activator. In one specific example, the thermochromic colorant is folic acid and the activator is an acid that has a pK of less that 4.2. Yet another suitable thermochromic composition provides a thermochromic composition including an electron-donating chromogeneic material, a 1,2,3-triazole compound, a weakly basic, sparingly soluble azomethine or carboxylic acid salt, and an alcohol, amide or ester solvent. Other examples of thermochromic compositions include combinations of at least one color-former and at least one Lewis acid in a polymer mixture. Such compositions reversibly change appearance from substantially transparent to substantially non-transparent above a first critical solution temperature. Another exemplary composition includes at least one electron-donating organic chromogenic compound, at least one compound serving as a color developing material and selected from thiourea and derivatives thereof, guanidine and derivatives thereof, benzothiazole, and benxothiazolyl derivatives, and at least one compound serving as a desensitizer selected from the group consisting of alcohols, esters, ketones, ethers, acid amides, carboxylic acids, and hydrocarbons.

Passive light transformative elements employed in certain embodiments of the color-tunable light-emitting devices may include color filters and phosphors. A suitable color filter may be a sheet of dyed glass, gelatin, or plastic which absorbs certain colors and permits better rendition of others.

Another suitable passive light transformative element may include one or more phosphors. A phosphor exhibits the phenomenon of phosphorescence. Phosphorescence may be defined as sustained light emission following an initial exposure to light. This is sometimes referred to as "glowing without further stimulus". Suitable phosphors may include one or more transition metal compounds or rare earth compounds. The term "transition metal" refers to an element in the d-block of the periodic table, including zinc and scandium. This corresponds to periodic table groups 3 to 12, inclusive. Compounds of the "inner transition elements" from the lanthanide and actinide series where the inner f orbital is filled as atomic number increases may also be used as the phosphor. The inner transition elements are made up of the elements from cerium Atomic No. 58 to lutetium Atomic No. 71 and thorium Atomic No. 90 to Lawrencium Atomic No. 103. Suitable rare earth compounds include oxides of the elements in the lanthanide series that include actinium, thorium, protactinium, uranium, neptunium, plutonium, americium, curium, berkelium, californium, einsteinium, fermium, mendelevium, nobelium and lawrencium.

Figure 10:
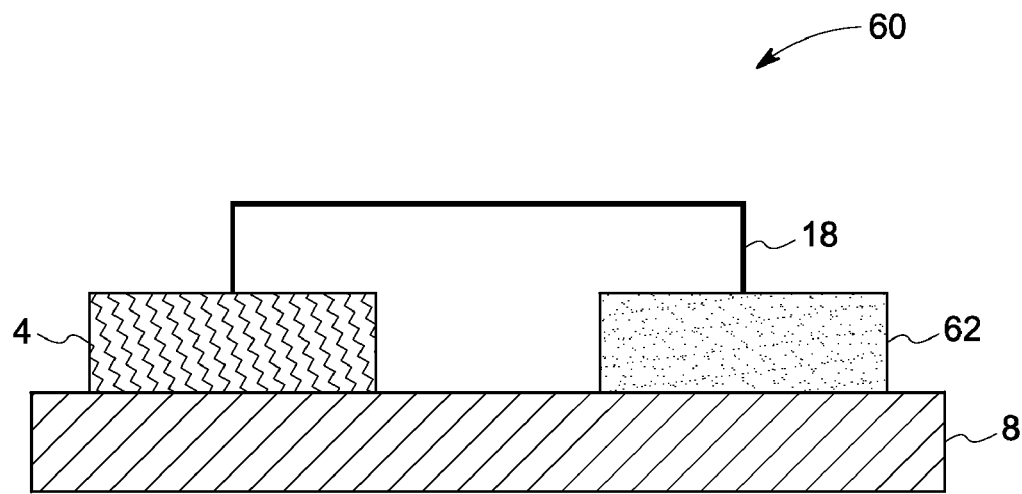
FIG. 10 is a representation of the change in color emitted from a color-tunable light-emitting device.

Referring to FIG. 10, a device 60 includes a light transmissive controller 4 and a color-tunable light-emitting device 62, both secured to a light transmissive element 8 to form the device. The light transmissive controller is connected to the color-tunable light-emitting device and controls the light transmissive organic electronic device by varying the applied voltage bias 18.

Figure 11:
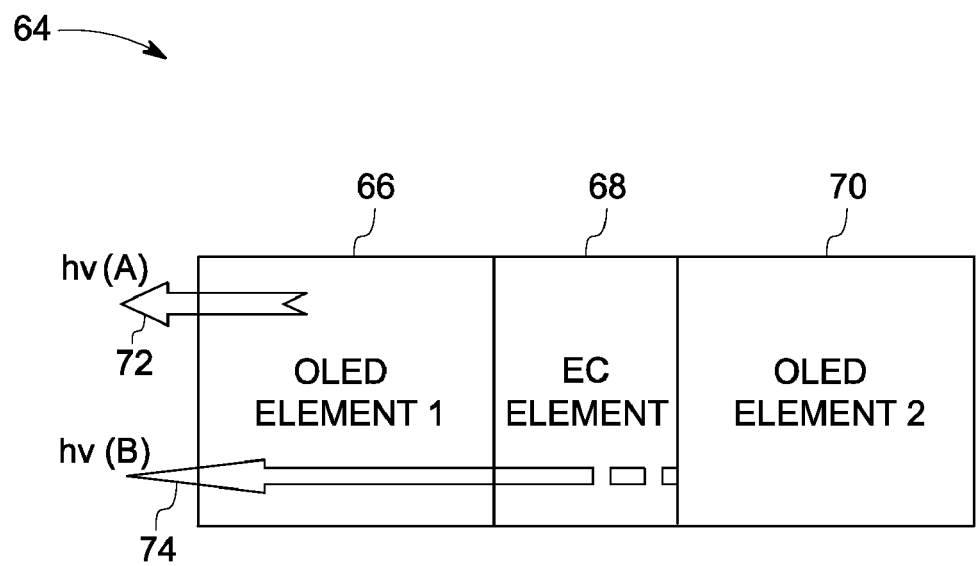
FIG. 11 is a schematic representation of an embodiment of a color-tunable light-emitting device.

Referring to FIG. 11, the color-tunable light-emitting device 64 includes a first OLED 66 and a second OLED 70 emitting light at different wavelengths. In one embodiment the first OLED may be a blue light-emitting OLED and the second OLED may be a red light-emitting OLED. Alternately, a different combination of OLED that emit light at different wavelengths may be used. For example the first OLED may be a red light-emitting OLED and the second OLED may be a blue light-emitting OLED. The transmission properties of the electrochromic EC element 68 can be tuned by varying an applied voltage bias. The perceived color of the light emerging from the device is thus a combination of the unmodulated light 72 emerging directly from the device and the modulated light 74, said modulated light being modulated by the electrochromic element. In one embodiment, the electrochromic element is substituted with a photochromic element. Where a photochromic element is used, the photochromic element can be tuned by coupling with a light tunable source. In one embodiment, the electrochromic element is replaced with a thermochromic element. When a thermochromic element is used the thermochromic element can be tuned by coupling with a temperature tunable source.

Figure 12:
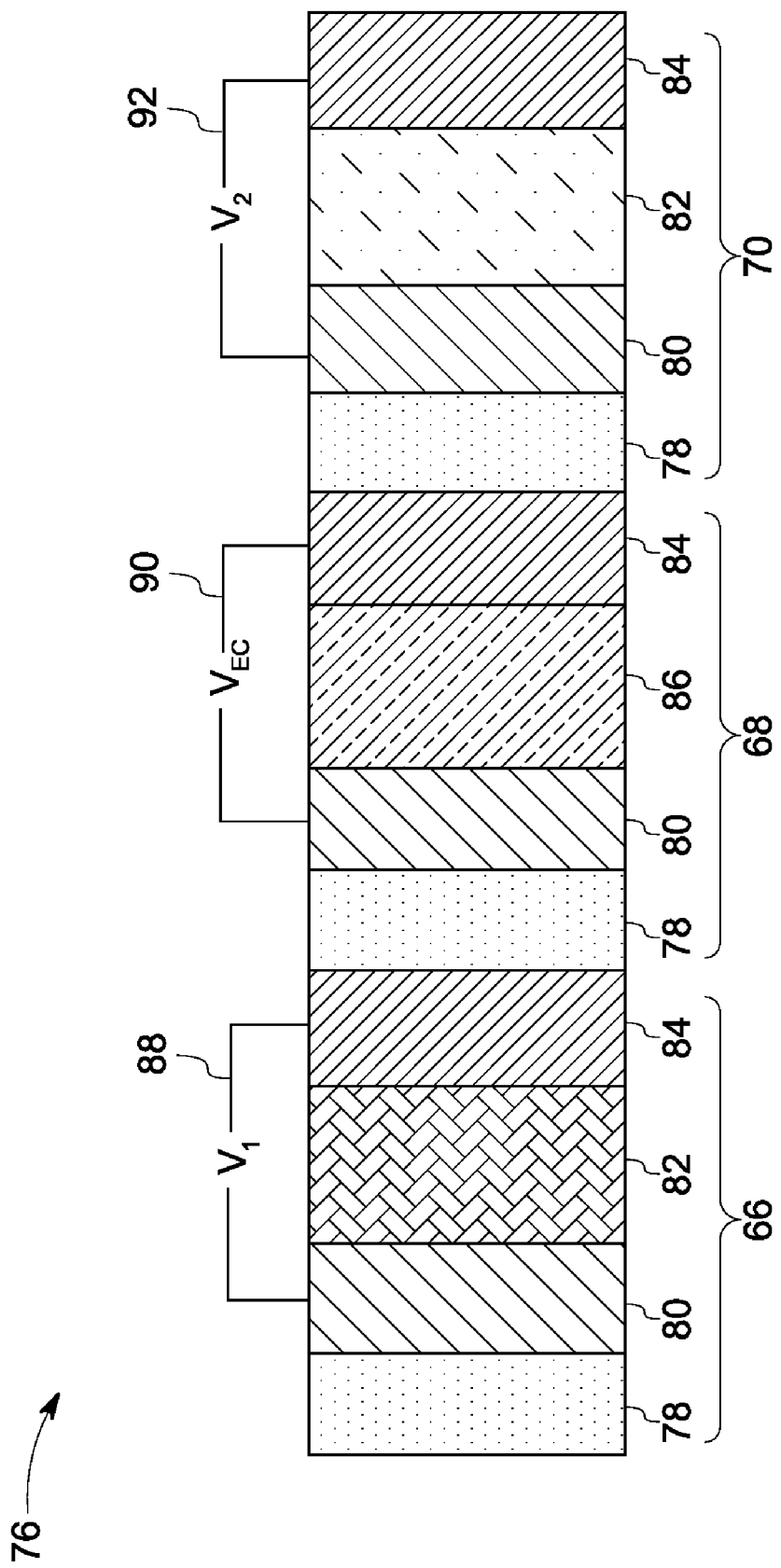
FIG. 12 is a cross-sectional representation of an embodiment of a color-tunable light-emitting device.

FIG. 12 shows a cross-sectional view 76 of the color-tunable light-emitting device 64 of FIG. 11. In this illustrated embodiment, the color-tunable light-emitting device includes a first OLED 66, the first OLED including a first substrate 78, a first electrode 80, a first electroluminescent layer 82, and a second electrode 84; an electrochromic element 68, the electrochromic element including a second substrate 78, a third electrode 80, an electrochromic layer 86, a fourth electrode 84; and a second OLED 70, the second OLED including a third substrate 78, a fifth electrode 80, a second electroluminescent layer 82 and a sixth electrode 84. The first OLED is separately connected to an external tunable voltage source 88, the electrochromic element is connected to external tunable voltage source 90 and the second OLED is also separately connected to an external tunable voltage source 92, indicating that the three elements discussed above (i.e., the first OLED, electrochromic element and the second OLED) are optically coupled but electrically isolated.

Figure 13:
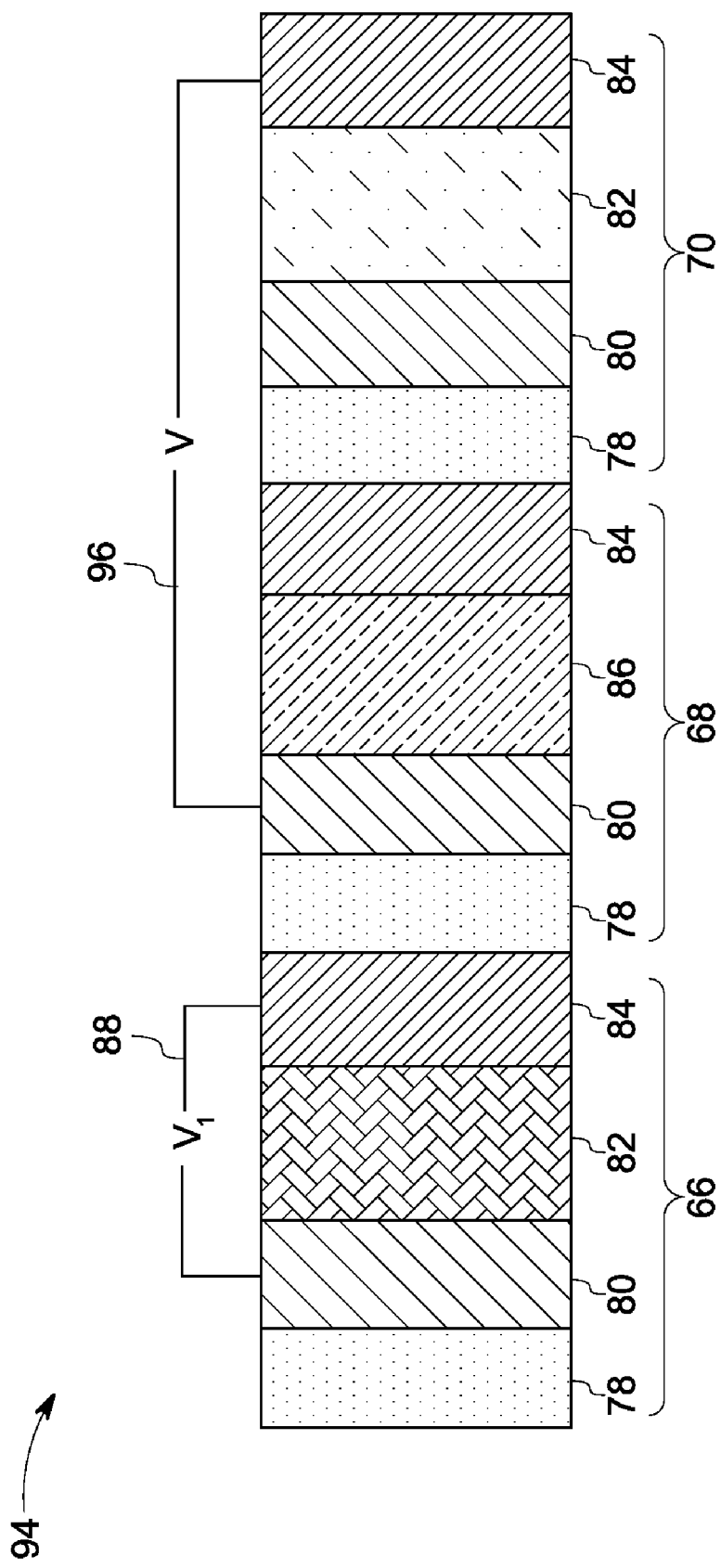
FIG. 13 is a cross-sectional representation of an embodiment of a color-tunable light-emitting device.

FIG. 13 shows a cross sectional view 94 of the color-tunable light-emitting device 64 of FIG. 11. In this illustrated embodiment, the color-tunable light-emitting device includes a first OLED 66, an electrochromic element 68, and a second OLED 70, as discussed above for FIG. 12. The difference lies in the connection of the external voltage source. The first OLED is separately connected to an external tunable voltage source. The electrochromic element and the second OLED are connected to a single external tunable voltage source 96, indicating that two of the elements are electrically coupled, and the first OLED is separately connected to an external tunable voltage. The first OLED, electrochromic element and the second OLED are optically coupled.

FIG. 14 illustrates an embodiment which is a color-tunable light-emitting device 98 including a photochromic element 100. FIG. 15 illustrates an embodiment that is a color-tunable light-emitting device 102 including a thermochromic element 104.

In one embodiment, the color-tunable light-emitting device may include a first light-emitting element, a second light-emitting element, a passive light transformative element and at least one light transmissive element, wherein the first light-emitting element and the second light-emitting element emit light at differing wavelengths. In one embodiment, the color-tunable light-emitting device may include at least one active light transformative element.

FIG. 16 illustrates an embodiment that is a color-tunable light-emitting device 106. The device includes an OLED 66, an active light transformative element, here an electrochromic element 68, a passive light transformative element, here a red phosphor layer 108, and a reflective element, here a mirror 110. The transmission properties of the electrochromic element can be tuned by varying an applied voltage bias. The perceived color is thus a combination of the unmodulated light 72 emerging directly from the device and modulated light 74, said modulated light being modulated by one or more of the light transformative elements. In one embodiment, the electrochromic element is replaced with a photochromic element. When a photochromic element is used the photochromic element can be tuned by coupling with a tunable light source. In yet another embodiment, the electrochromic element is replaced with a thermochromic element. When a thermochromic element is used the thermochromic element can be tuned by coupling with a temperature tunable source.

FIG. 17 represents a cross-sectional view 112 of the color-tunable light-emitting device 106 of FIG. 16. In this illustrated embodiment, the color-tunable light-emitting device is shown to include an OLED 66, an electrochromic element 68, a passive light transformative element, here a red phosphor 108, and a reflective element, here a mirror 110. The OLED and the electrochromic element are together connected to a single external tunable voltage source 114, indicating that two of the elements are electrically coupled and all elements discussed above i.e., the OLED, electrochromic element, the passive light transformative element, and the mirror are optically coupled.

FIG. 18 illustrates an embodiment which is a color-tunable light-emitting device 116 including an OLED 66, an active light transformative element which is an electrochromic element 68, and a passive light transformative element, here a red phosphor 108; the transmission of the electrochromic element can be tuned by varying an applied voltage bias. The perceived color is thus a combination of the unmodulated light 72 emerging directly from the device and modulated light 74, said modulated light being modulated by one or more of the light transformative elements.

FIG. 19 represents a cross sectional view 118 of the color-tunable light-emitting device 116 of FIG. 18. The color-tunable light-emitting device includes an organic light-emitting device 66, an electrochromic element 68, and a passive light transformative element, here a red phosphor 108. FIG. 19 also shows a power supply 114 which applies a voltage bias across both the organic light-emitting device and the electrochromic element.

FIG. 20 illustrates an embodiment which is a color-tunable light-emitting device 120 including an organic light-emitting device 66, a first passive light transformative element, here a red phosphor 108; a second passive light transformative element, here a green phosphor 122, a first electrochromic element 68, a second electrochromic element 124, and a reflective element, here a mirror 110. Alternately, a different combination of OLED, first passive light transformative element and second light transformative element that emit light at different wavelengths may be used.

The transmission of the electrochromic elements can be tuned by varying the applied voltage bias. The perceived color is a combination of the unmodulated light 72 emerging directly from the device and modulated light 74, said modulated light being modulated by one or more of the light transformative elements. Green modulated light is indicated in FIG. 20 as "hv2". Red modulated light is indicated in FIG. 20 as "hv3".

FIG. 21 illustrates an embodiment that is a color-tunable light-emitting device 126. The device 126 is very similar to that shown in FIG. 20 except that there is no reflective element on one end.

FIG. 22 illustrates an embodiment, shown in a cross-sectional view, which is a color-tunable light-emitting device 128 including an OLED 66, a photochromic element 100, a passive light transformative element, here a red phosphor 108, a reflective element, here a mirror 110, and a power supply 114.

FIG. 23 illustrates an embodiment, shown in a cross-sectional view, which is a color-tunable light-emitting device 130 including an OLED 66, a thermochromic element 102, a passive light transformative element, here a red phosphor 108, a reflective element, here a mirror 110, and a power supply 114.

The reflective elements that can be employed in certain embodiments include but are not limited to mirrors and aluminum film. Mirrors may include highly reflective metallic foils, or a metal film on a glass or a plastic substrate.

A device is provided in one embodiment of the invention. The device includes at least one light transmissive element, a plurality of light transmissive organic electronic devices, and at least one light transmissive thin film transistor. The light transmissive thin film transistor includes carbon nanotubes. The plurality of light transmissive organic electronic devices and the light transmissive thin film transistor are secured to the light transmissive element.

In one embodiment, the light transmissive element and the light transmissive organic electronic devices may be the same or similar to that discussed above. The light transmissive thin film transistor has four components, like the TFT discussed above. The components include a source electrode, a drain electrode, a gate electrode, and a conducting channel. At least one of these four components, besides the conducting channel, includes at least one carbon nanotube network. A carbon nanotube transistor can be employed where a carbon nanotube network provides the source and drain, the conducting channel and the gate electrode; or a carbon nanotube network used for the source and drain; and a carbon nanotube network used for the conducting channel; or a carbon nanotube network used for the source and drain; and a carbon nanotube network used for the gate; or a carbon nanotube network used for the gate; and a carbon nanotube network used for the conducting channel.

The carbon nanotubes used to make the networks can be undoped, or can be doped for p-type transistors and n-type transistors. The networks may include two differing species, such as carbon nanotubes and polyaniline to provide different conducting properties; the networks with differing densities at different locations on the substrate may be used; the networks can be patterned on the surface to provide some areas that are covered some areas that are not covered. Other nanomaterials may be employed in conjunction with or as a replacement for the carbon nanotubes. Suitable nanomaterials include nano-wires having dimensions less than 900 nanometers in diameter (the diameter is the average of the cross-sectional width) and having an aspect ratio exceeding 10. Suitable nanomaterials may include single element nano-wires made from silicon, from a combination of Group III-V materials Ga, In, N, P, As and Sb, from a combination of Group II-VI materials Zn, Cd, Hg, S, So and Te, from metal oxides CdO, $Ga_2O_3$, $In_2O_3$, MnO, NiO, PbO, $Sb_2O_3$, $SnO_2$, and ZnO, from metal chalcogenides Mn, Fe, Co, Ni, Cu, Ag, Sn, Pb and Bi. Other suitable nanomaterials may include conducting polymers polyanilino, polypyrrole, and polythiophene. And, yet other suitable nanomaterials may include metals and alloys.

Figure 24:
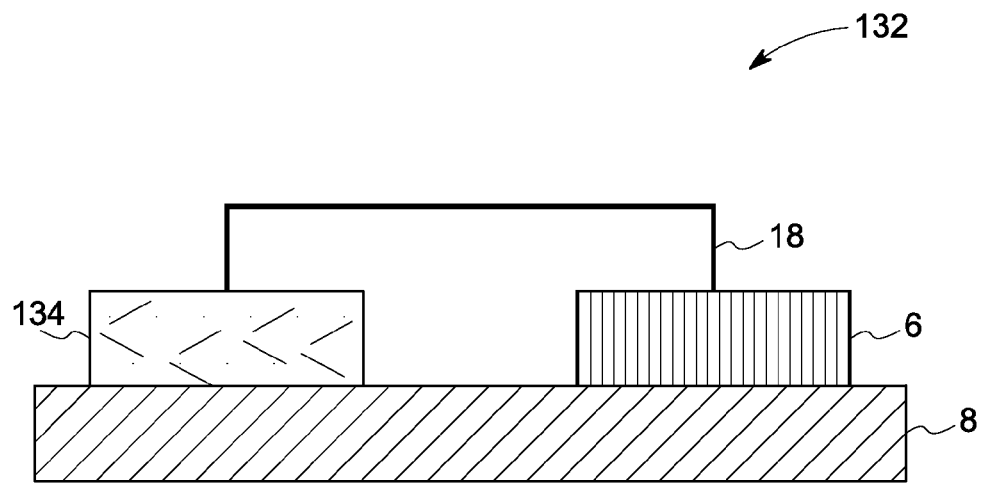
FIG. 24 is a schematic representation of an embodiment of a device according to the invention.

Referring to FIG. 24, a device 132 includes a light transmissive thin film transistor 134 and a light transmissive organic electronic device 6, both secured to a light transmissive element 8 to form the device. The light transmissive thin film transistor includes carbon nanotubes. The light transmissive thin film transistor connects to the light transmissive organic electronic device and controls the light transmissive organic electronic device by controlling the applied voltage bias 18.

Figure 25:
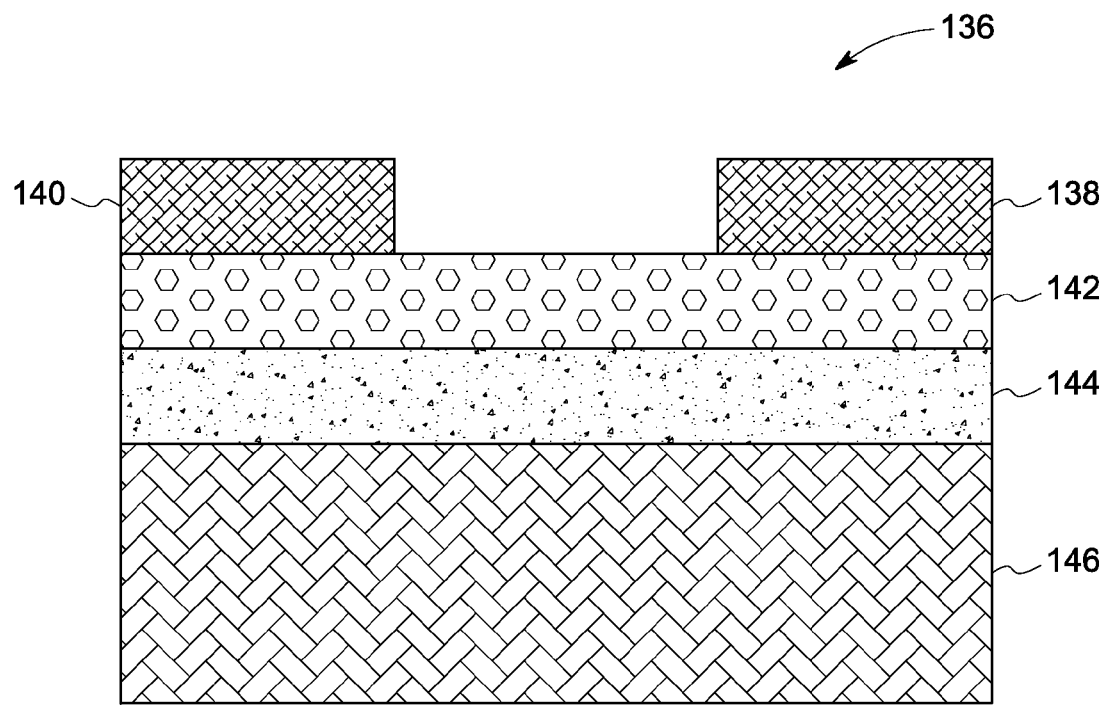
FIG. 25 is a side view of a bottom-gated transistor.

Referring to FIG. 25, a schematic illustration of a side view of a bottom-gated transistor 136 is provided. The transistor has a source electrode 140, a drain electrode 138, and a conducting channel 142. The conducting channel is disposed on a dielectric layer 144 and gate electrode 146. The conducting channel may include carbon nanotubes. In addition, at least one of the source electrode, drain electrode and gate electrode includes carbon nanotubes. Any combination of one, two, three or four of the source electrode, drain electrode, conducting channel and gate electrode may include carbon nanotubes.

Figure 26:
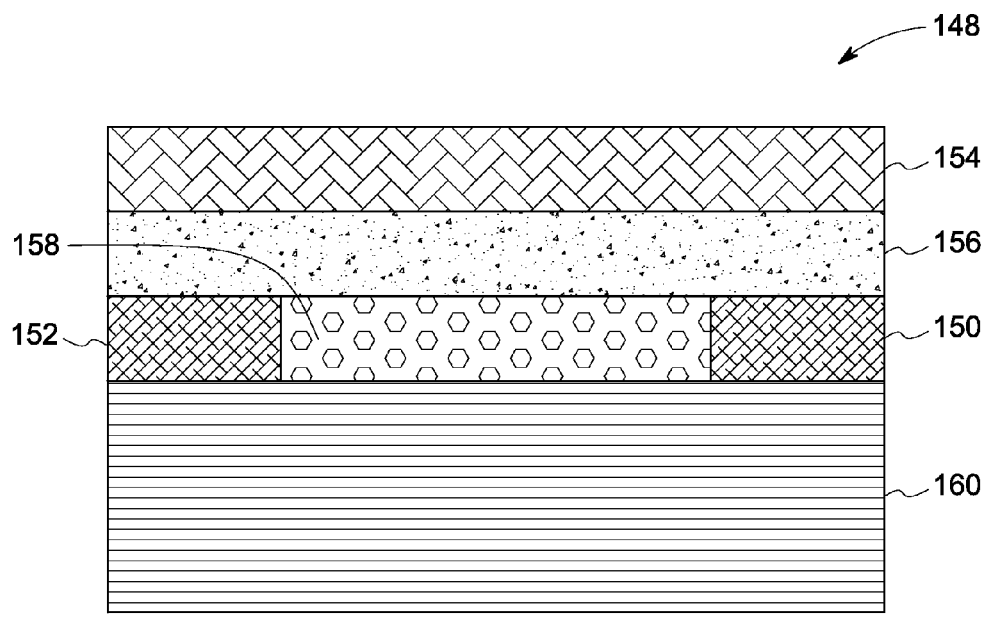
FIG. 26 is a side view of a top-gated transistor.

Referring to FIG. 26, a schematic illustration of a side view of a top-gated transistor 148 is provided. Source electrode 152 and drain electrode 150 are formed on an insulating substrate 160. A conducting channel 158 is formed on the substrate between the source electrode and the drain electrode. A dielectric layer 156 and a gate electrode 154 are formed on the combined structure of the source electrode, conducting channel, and drain electrode. The conducting channel may include carbon nanotubes. At least one of the source electrode, drain electrode, and gate electrode include carbon nanotube.

Figure 27:
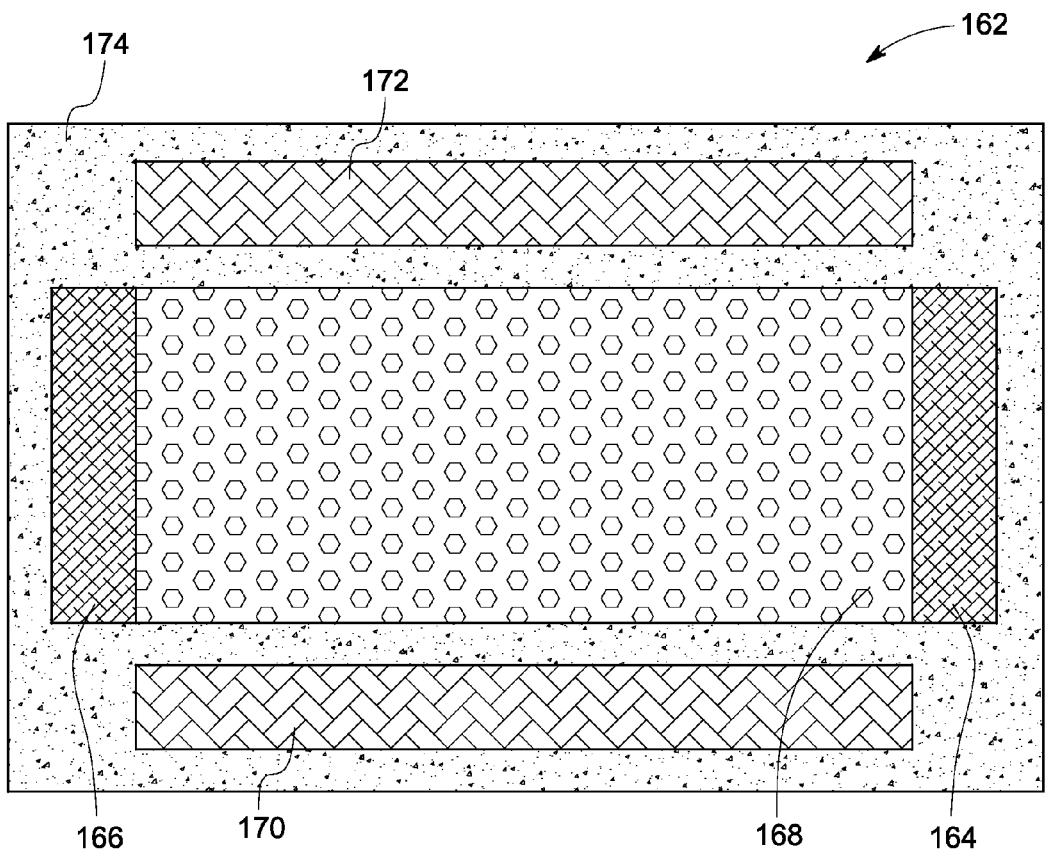
FIG. 27 is a top view of a side-gated transistor.

Referring to FIG. 27, a schematic illustration of a side view of a side-gated transistor 162 is provided. The transistor has a source electrode 166 and a drain electrode 164. The source and the drain electrodes are spaced apart from each other, and formed on a dielectric layer 174. A conducting channel 168 is formed on the dielectric layer between the source electrode and the drain electrode. The transistor has a first gate electrode 172 and a second gate electrode 170 formed on the dielectric layer spaced apart from each other with the conducting channel in between. The conducting channel may include carbon nanotubes. In addition, at least one of the source electrode, drain electrode, first gate electrode and second gate electrode include carbon nanotubes.

A device is provided in one embodiment of the invention that includes a light transmissive element, a nano-wire light-emitting device nano-LED, and a light transmissive controller communicating with the nano-wire light-emitting device. The nano-wire light-emitting device and the light transmissive controller, are supported by the light transmissive element.

With regard to the nano-LED, it may include an electrically conductive element and a light-emitting nano-wire device including at least one p-n or p-i-n diode. The electrically conductive element may be light transmissive. Suitable materials that may be used as the light transmissive element may be the same as or similar to the light transmissive element described above.

In one embodiment, the light emitting nanowire device is a p-n diode or multiple p-n diodes. In a light-emitting p-n diode, light emits at interface of p-type segment and n-type segment. Some light emitted along the axis of the nanowire may absorb by the nanowire. In another embodiment, the light emitting nanowire device is a p-i-n diode or multiple p-i-n diodes. In a p-i-n diode, light emits from the i-layer. The i-layer is a quantum well or multiple quantum wells. P segment and n-segment in the nanowire have larger bandgap than the i-layer and therefore are transparent to the emitted light along the nanowire axis.

In one embodiment, the electrically conductive element may include a single component including any useful conductive material.

In another embodiment, the electrically conductive element may additionally include a light transmissive substrate wherein the conductive material may be disposed on the light transmissive substrate to provide the electrically conductive element. Suitable materials that may be used as the light transmissive substrate may be the same as or similar to the light transmissive element described above. Suitable materials that may be used as the electrically conductive material may be the same as or similar to the conductive material used in the source/drain electrodes described above. Suitable light transmissive controllers may include the light transmissive controllers described above.

In one embodiment, the light-emitting nano-wire device may include multiple nano-wire light-emitting diodes. Each may include a structure of a p-type semiconducting segment and an n-type semiconducting segment. Optionally, an undoped light-emitting segment is inserted between p-type segment and n-type segment. Suitable materials that may be used as the light-emitting nano-wires include a semiconductor light-emitting material selected from III-V or II-VI semiconductors with a direct bandgap. Suitable semiconductor materials may include gallium nitride, zinc selenide, gallium arsenide, or zinc oxide.

In one embodiment, the light-emitting nano-wire device may include a cover layer disposed on the electrically conductive element. The cover substrate may provide a more robust light-emitting nano-wire device. Suitable materials that may be used as the cover substrate may be the same as or similar to the material described above for the light transmissive element.

In one embodiment, the cover substrate may have a surface plated with a metal layer. Suitable materials that may be used as metal layer include Al, Ag, Au, Ba, Ca, In, K, Li, Mg, Mn, Na, Pb, Sr, Sn, Sc, Y, Zn, Zr, and elements of the lanthanide series. Other suitable materials may include metal alloys, such as Ag—Mg alloy, Al—Li alloy, In—Mg alloy, Al—Ca alloy, Li—Al alloy, and Ca—Ga alloy. In one embodiment, the metal layer on the cover substrate and the electrically conductive element may serve as electrode conductors.

In various embodiments, the nano-wire light-emitting diodes may be grown using a vapor phase-liquid phase-solid phase (VLS) growth technique or a metal-organic chemical vapor deposition (MOCVD) growth technique.

In one embodiment, a layer of a metal catalyst may be coated on the surface of the electrically conductive element and the coated element may be placed in an oven at a temperature of about 400 degrees Celsius to about 700 degrees Celsius resulting in the formation of nano sized spots on the metal coating. This may be followed by passing vapors of a semiconductor light-emitting material over the metal coating resulting in the growth of nano-wire light-emitting diodes on the surface of the electrically conductive element. In one embodiment, the light-emitting nano-wires may be grown on the cover substrate in a similar manner as described above. Suitable materials that may be used as the metal catalyst may include gold and a eutectic made of tin, antimony, lead, silicon, germanium, and/or bismuth. In one embodiment, the thickness of the layer of metal catalyst is in a range of from about 5 nanometers to about 50 nanometers. In another embodiment, the catalyst may be uniformly dispersed catalytic nanoparticles.

Optionally, an insulation layer support post may be disposed between the light transmissive conductive element and the cover substrate for supporting the light transmissive conductive element and the cover substrate. In one embodiment, the insulation layer support post may be disposed on the light transmissive conductive substrate. In one embodiment, the insulation layer support post may be disposed on the cover substrate. Suitable materials that may be used to make the insulation layer support post include silica and a heat-proof light-resistant material.

In one embodiment, the light-emitting nano-wire device include nano-wire light-emitting diodes which may form a light-emitting block, and a single light-emitting block or multiple light-emitting blocks may form a planar light source. In one embodiment, the nano-wire light-emitting diodes may emit rays in a wavelength region of about 350 nanometers to 395 nanometers (ultraviolet rays) in a wavelength region of about 395 nanometers to about 420 nanometers (violet rays), or in a wavelength region of about 420 nanometers to about 430 nanometers (yellow rays), or in a wavelength region of about 430 nanometers to about 470 nanometers (blue rays).

In one embodiment, if the light-emitting nano-wire device emits blue rays, the light-emitting surface of the light-emitting nano-wire device may be coated with a yellow fluorescent material to produce two-wavelength white rays, or may be coated with a red and a green fluorescent material to produce three-wavelength white rays.

In one embodiment, the light-emitting surface is coated with green or red fluorescent material, so that when the light-emitting nano-wires emits blue rays the green fluorescent material may produce green rays, and the red fluorescent material may produce red rays, and the places not coated with green or red fluorescent material may produce blue rays, thereby forming a full color display with red, blue and green colors.

In one embodiment, if the light-emitting nano-wire device emits violet rays, the light-emitting surface may be coated with red, blue or green fluorescent material, so as to produce red, blue or green rays, thereby forming a full color display with red, blue and green colors, or the light-emitting surface may be coated with mixed red, blue and green fluorescent material, so as to produce white rays. In one embodiment, when the nano-LEDs emit violet rays, suitable materials that may be employed as the red fluorescent material may include $3.5MgO.0.5MgF_2GeO_2$:Mn or $6MgO.AS_2O_5$:Mn, the blue fluorescent material may include ZnS:Cu, Al or $Ca_2MgSi_2O_7Cl$, and the green fluorescent material may include $BaMgAl_{10}O_{17}$:Eu or (Sr, Ca, Ba Mg)$_{10}$(PO$_4$)$_6$Cl$_2$:Eu.

In one embodiment, when the light-emitting nano-wire device emits ultraviolet rays, the light-emitting surface may be coated with red, blue or green fluorescent material, so as to produce red, blue or green rays, thereby forming a full color display with red, blue and green colors, or the light-emitting surface may be coated with mixed red, blue and green fluorescent material, so as to produce white rays. In one embodiment, when the nano-wire light-emitting device emits ultraviolet rays, suitable materials that may be employed as the red fluorescent material may include $Y_2O_2S_2$:Eu, the blue fluorescent material may include $BaMgAl_{10}O_{17}$:Eu or (Sr, Ca, Ba, Mg)$_{10}$(PO$_4$)$_6$Cl$_2$:Eu, and the green fluorescent material may include $BaMgAl_{10}O_{17}$:Eu, Mn.

If the light-emitting nano-wire device emits blue light, and the nano-wire eutectic bonding has a lower temperature, the light-emitting nano-wire device may use the structure such that the heat-proof light-resistant layer serves as the support post.

Figure 28:
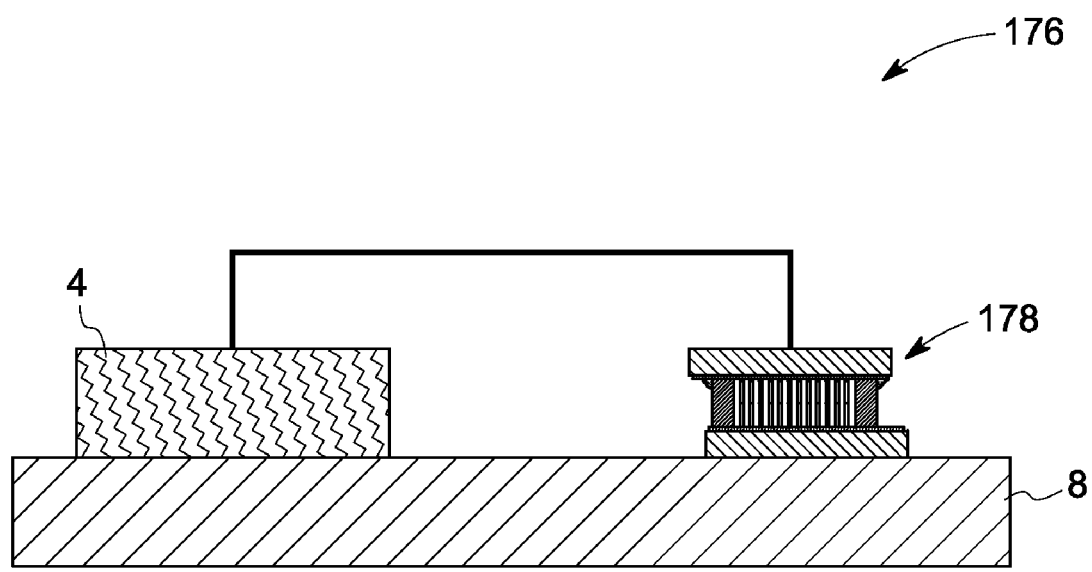
FIG. 28 is a schematic representation of an embodiment of a device according to the invention.

Referring to FIG. 28, a device 176 includes a light transmissive controller 4 and a nano-LED 178. Both secure to light transmissive element 8. The light transmissive controller can control the light-emitting nano-wire device by controlling or varying an applied voltage bias 18.

Figure 29:
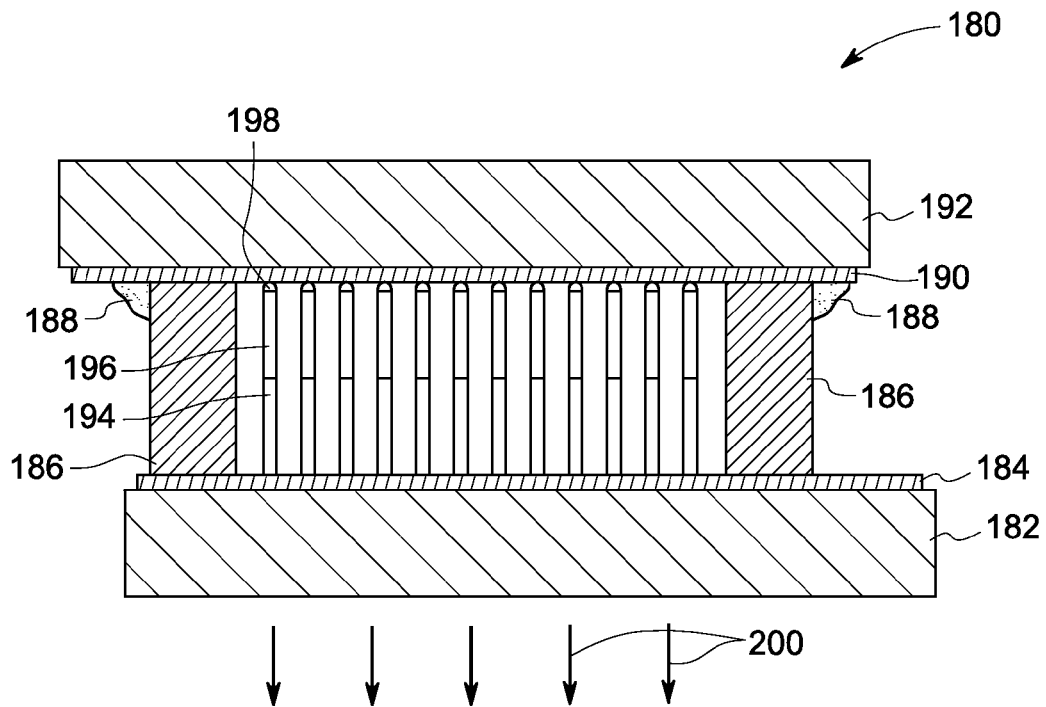
FIG. 29 is a cross-sectional view of an embodiment of a nano-wire light-emitting device.

Referring to FIG. 29, the light-emitting nano-wire device 180, has a light transmissive conductive element made of a light transmissive substrate 182 coated with a conductive element 184. The conductive element is plated with an insulation layer (not shown in figure). Then a light resistant layer (not shown in figure) is coated on the surface of the insulation layer. An exposure and development zone (not shown in figure) is formed on the light resistant layer and this may be removed by etching to form an etching zone (not shown in figure). A part of the insulation layer remains after the formation of the etching zone, and this part serves as the insulation layer support post 186 between the light transmissive conductive element and the cover substrate 192. The light transmissive conductive element may be coated with a metal catalyst 198 and is heated so that the metal catalyst may form nanoscale particles. The light resistant layer may be removed, and the light transmissive element may be coated with a conductive element. The metal catalyst layer may be placed in a furnace to grow the nano-wires by the VLS method, to form an n-type semiconductor nano-wire segment 194 and a p-type semiconductor nano-wire segment 196 thereby forming a light-emitting nano-wire device with a p-n interface. Optionally, an i-layer comprising a quantum well or multiple quantum wells is formed between the p-type segment and the n-type segment. A cover substrate 192 having an inner surface coated with an eutectic alloy layer 190 may be disposed on the light transmissive conductive element having the grown nano-wires. Each of the cover substrate and the light transmissive conductive element may be pre-provided with connecting terminals. The cover substrate may be heated, so that the eutectic alloy material on the inner face of the cover substrate may be bonded with the metal catalyst on the top of the nano-wires. A bonding glue 188 may be coated on the connection of the cover substrate and the light transmissive conductive element. The bonding glue may prevent water from infiltrating into the elements. The light-emitting nano-wire responds to power flow by emitting light 200 that projects out through the surface of the light transmissive conductive element.

Figure 30:
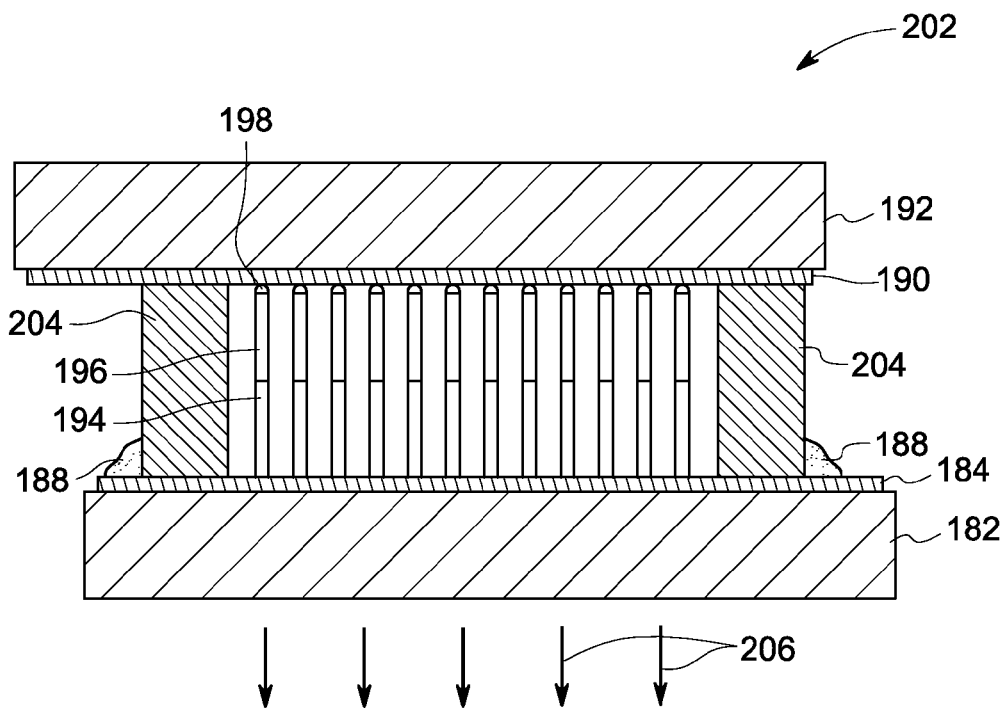
FIG. 30 is a cross-sectional view of an embodiment of a nano-wire light-emitting device.

Referring to FIG. 30, a light-emitting device 202 differs from the device shown in FIG. 29 in that the material of the insulation layer post is a heat-proof light resistant layer 204. Another difference is that the nano-wire light-emitting diodes and the heat-proof light resistant layer are disposed on the cover substrate. Then, a bonding glue 188 may be coated on the connection of the cover substrate and the light transmissive conductive element. Then, the power is turned on, so that the light 206 may be emitted from the surface of the light transmissive conductive element.

Figure 31:
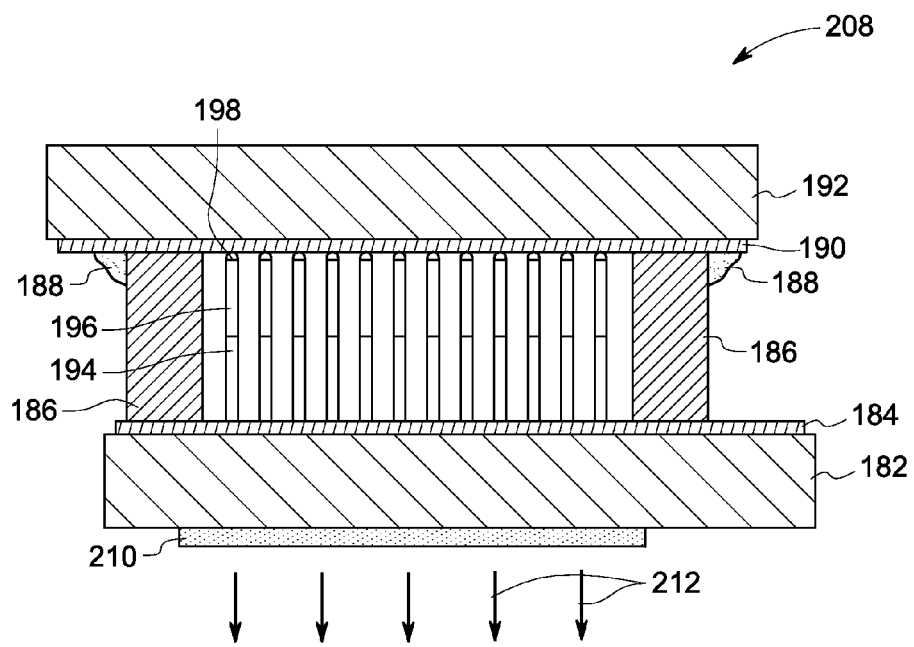
FIG. 31 is a cross-sectional view of an embodiment of a nano-wire light-emitting device.

Referring to FIG. 31, the nano-LED 208 may emit ultraviolet rays, and the nano-LED panel may be coated with fluorescent powder 210 mixed with the red, blue and green colors, thereby emitting a white light 212.

Figure 32:
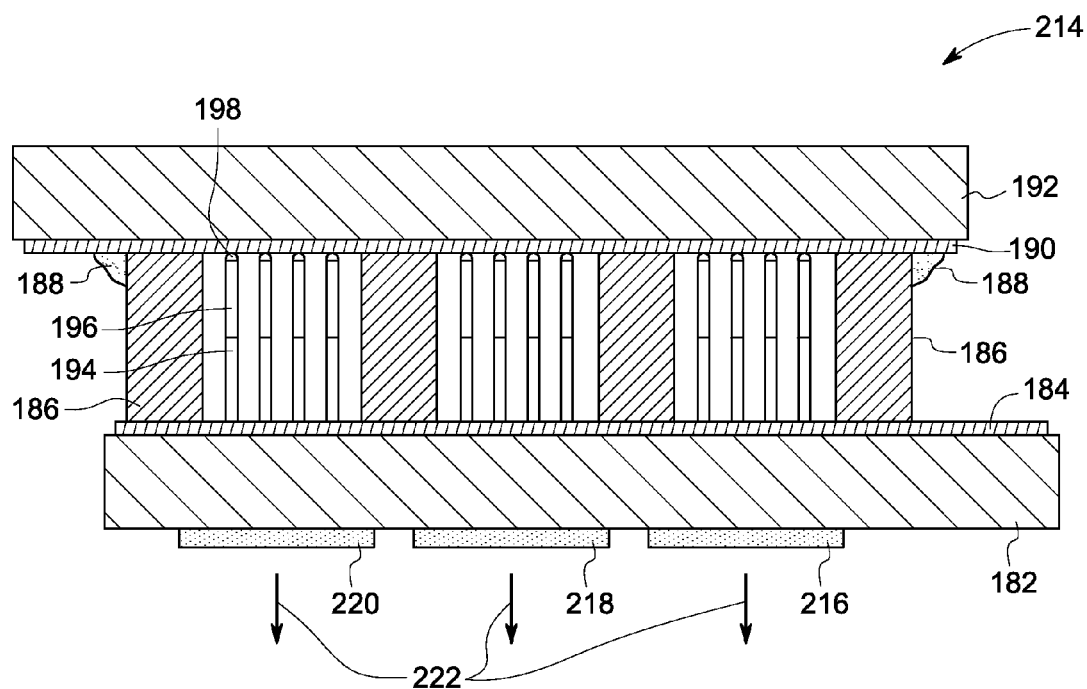
FIG. 32 is a cross-sectional view of an embodiment of a nano-wire light-emitting device.

Referring to FIG. 32, the nano-LED 214 includes multiple (three) light-emitting blocks forming a planar light source. The light emitting points 216, 218, and 220 of the nano-LED 214 may be coated with red, blue and/or green colors, thereby forming a full color display.

An article is provided in one embodiment of the invention. The article includes a plurality of devices. The plurality of devices includes at least a first device and a second device. Each of the first and second devices have surfaces that contact each other to define a stack. The light-emitting device in the first device includes a red, green or blue light-emitting element, and the light-emitting device in the second device includes a red, green or blue light-emitting element. A proviso is that the light-emitting element of the second light-emitting device differs from the light-emitting element of the first light-emitting device. A group of pixels of the light emitting from the article, as visualized by a viewer, is a voxel that can be a color defined by the on/off state of the light-emitting device layers or by the relative power/light output. In one embodiment, at least one of the light-emitting devices employed is a nano-wire LED.

In one embodiment, the article may further include a third layer in the stack including a red, green or blue light-emitting element with the proviso that the light-emitting element of the third layer differs from the light-emitting element of the first and second light-emitting device's light-emitting elements. In one embodiment, the layers in the article are arranged relative to each other so that the light having the most transmittable wavelength is transmitted from deeper in the stack.

Figure 33:
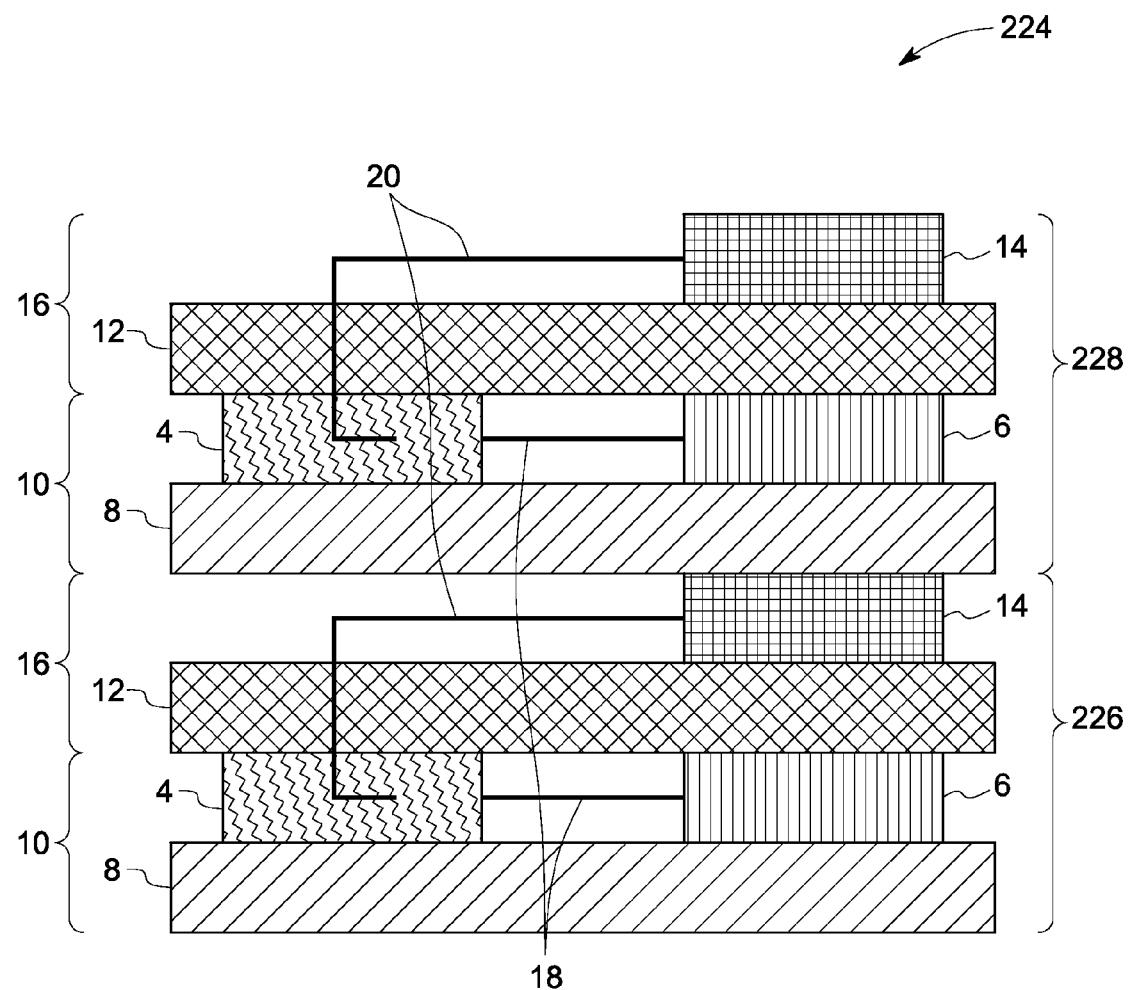
FIG. 33 is a schematic representation of an embodiment of a device according to the invention.

Referring to FIG. 33, two of the devices as shown in FIG. 1 are overlaid and stacked together to form an article 224. The first stack device 226 and the second stacked device 228 each include a light transmissive controller and a light transmissive organic electronic device that are secured to a respective light transmissive element. The light transmissive element in this embodiment may be an unreinforced, flexible thermoplastic sheet having a thickness of about 0.25 millimeters, and a transparency or light transmission of greater than 85 percent at 550 nanometers wavelength. The light transmissive organic electronic device in the first stack device is red. In the first stack device, the light transmissive controller connects to both the first OLED 6 and the second OLED 14 and controls both the light transmissive organic electronic devices by varying the applied voltage bias. The light transmissive organic electronic device in the second stack device is blue, and has a green phosphor operably coupled thereto. The first OLED and the second OLED may emit light at different wavelengths. For example, the first OLED may be a blue light-emitting diode and the second OLED may be a red light-emitting diode. Alternately, a different combination of OLED, each of which emit light at different wavelengths, may be used. The perceived color of the light emerging from the article is a combination of the unmodulated light emerging directly from the article and the modulated light, the modulated light being modulated by the light transmissive controller.

In one embodiment, the article of the invention may include additional layers such as one or more of a barrier layer, an abrasion resistant layer, an adhesion layer, a chemically resistant layer, a photoluminescent layer, a radiation-absorbing layer, a radiation reflective layer, a planarizing layer, an optical diffusing layer, and a light management film.

The barrier layer may include a graded composite barrier coating having an organic component and an inorganic component may be used with a suitable OLED layer. The barrier coating may have greater than 50 percent light transmission of light in the visible wavelength. In one embodiment, the barrier coating light transmission level may be in a range of from about 50 percent to about 60 percent, from about 60 percent to about 70 percent, from about 70 percent to about 80 percent, from about 80 percent to about 90 percent, or greater than about 90 percent transmission of light in the visible wavelength.

A suitable graded composite barrier coating may be the reaction product of reacting plasma species that are deposited onto a substrate surface. Organic coating materials may include carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, and aromatics having up to about 15 carbon atoms. Suitable inorganic coating materials may include an aluminide, boride, carbide, nitride, oxide, or silicide of an element from Groups IIA, IIIA, IVA, VA, VIA, VIIA, IB, and IIB; metals of Groups IIIB, IVB, and VB of the periodic table of elements. Other suitable inorganic materials may include an aluminide, boride, carbide, nitride, oxide, or silicide of one or more rare-earth metals.

Light management films may be used in the article to help mask physical defects, such as for example, specks, lint, and scratches, and also defects that may be observed due to optical phenomena. The light management films provide control over the direction of light, transmitted and/or reflected. The films may be used to increase brightness or to reduce glare in articles.

Figure 34:
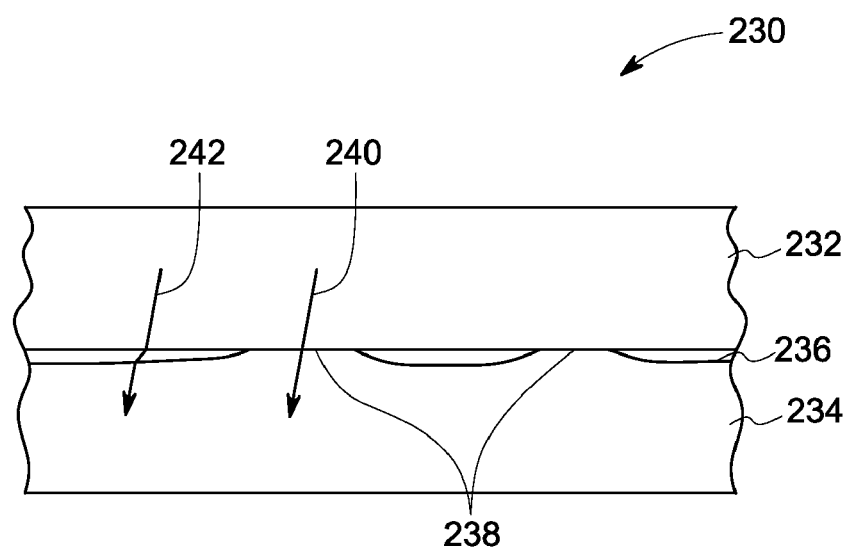
FIGS. 34 and 35 illustrate the problem of wet-out occurring between adjacent films.
Figure 35:
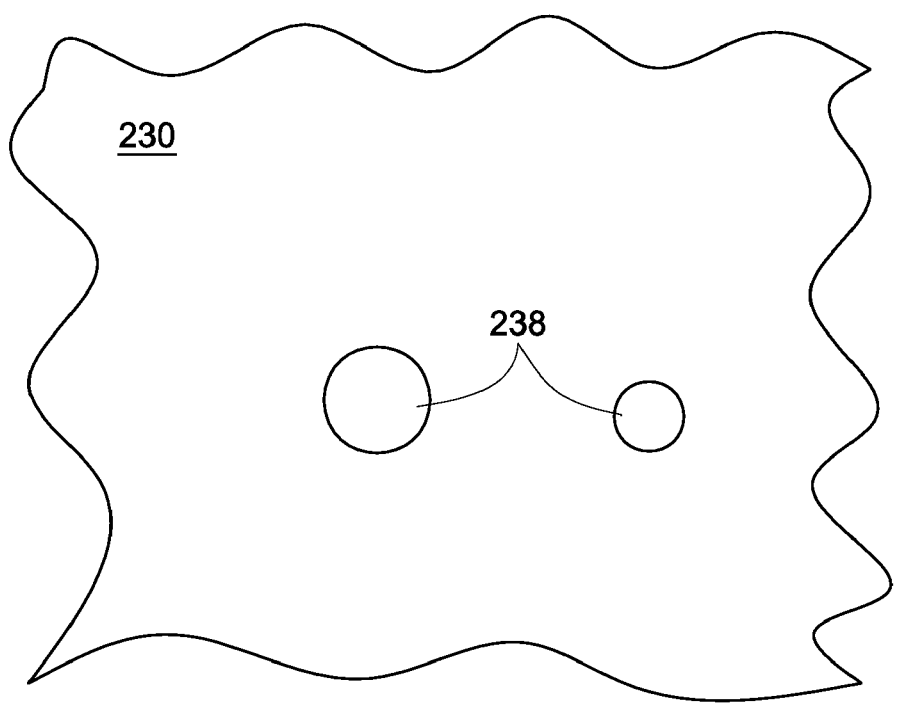

FIGS. 34 and 35 illustrate the formation of wet-out in a multi-layer display device 230. The multi-layer device is shown to have at least a first layer 232 and a second layer 234. The first surface 236 of the second layer is optically contacted at optical contacting points 238 to the first layer. When optical contacting occurs, any light ray 240 that passes through the optical contacting points passes from one layer into the next layer with a reduced refractive effect. Where the refractive indices of the first and the second layers are identical, there is no refractive effect. In contrast, where light passes from the first layer to the second layer where there is no optical contacting points, for example as shown for light ray 242, the light is refracted at each layer-air interface. The viewer detects wet-out regions 238, caused by the optical contacting points. The transmissive properties of the wet-out regions are different from the surrounding area and therefore may be viewed as an abnormality or a defect.

Figure 36:
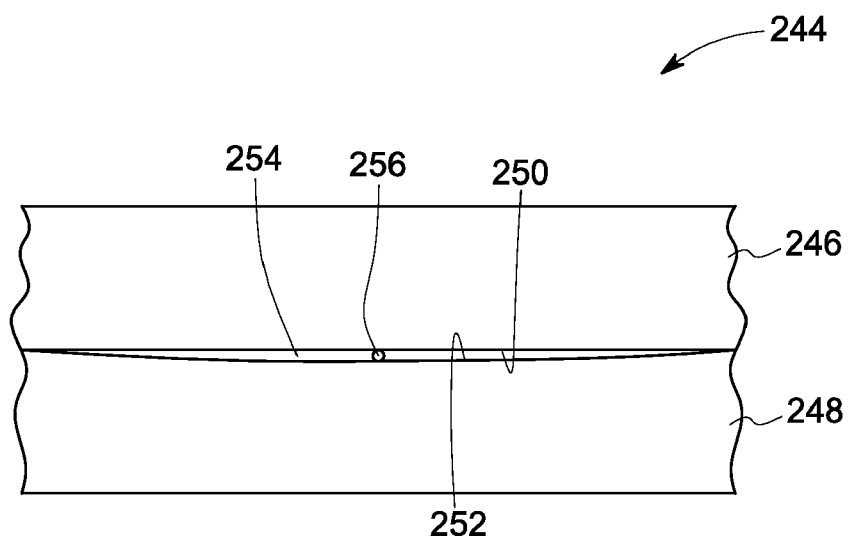
FIGS. 36 and 37 illustrate the problem of Newton's rings formed between adjacent films.
Figure 37:
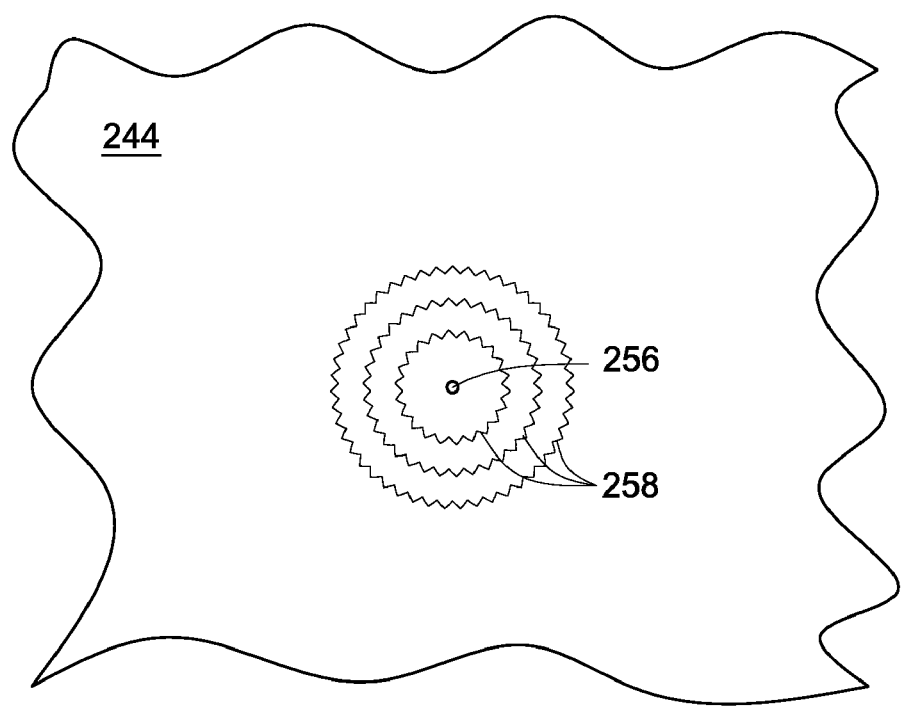

FIGS. 36 and 37 illustrate the formation of Newton's rings, which may be viewed either in transmission or in reflection. Newton's rings may be formed in a multi-layer display device 244, having at least a first layer 246 and a second layer 248. A particle of dust 256 may be trapped between the first and the second layer, resulting in an air gap 254 between respective second and first surfaces 250 and 252 of the first and the second layers. The separation between the second and first surfaces varies with distance from the dust particle. Interference rings are formed by light passing through the multi-layer display device where the air gap is a multiple of half wave lengths of light, as is commonly understood for the formation of Newton's rings 258.

Figure 38:
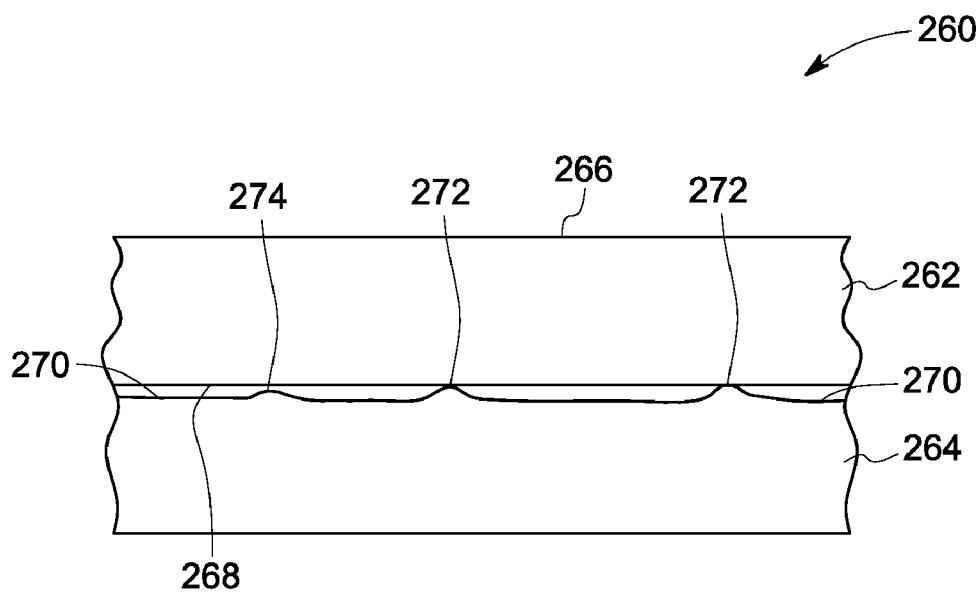
FIGS. 38 and 39 illustrate the anti wet-out effect obtained by using a light management film.
Figure 39:
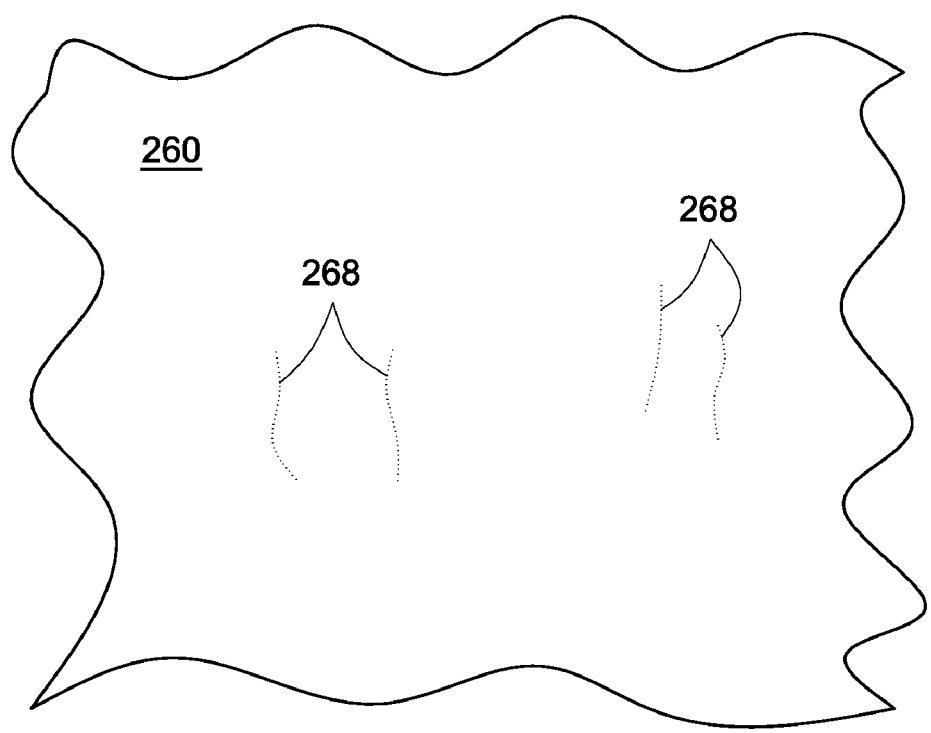
Figure 40:
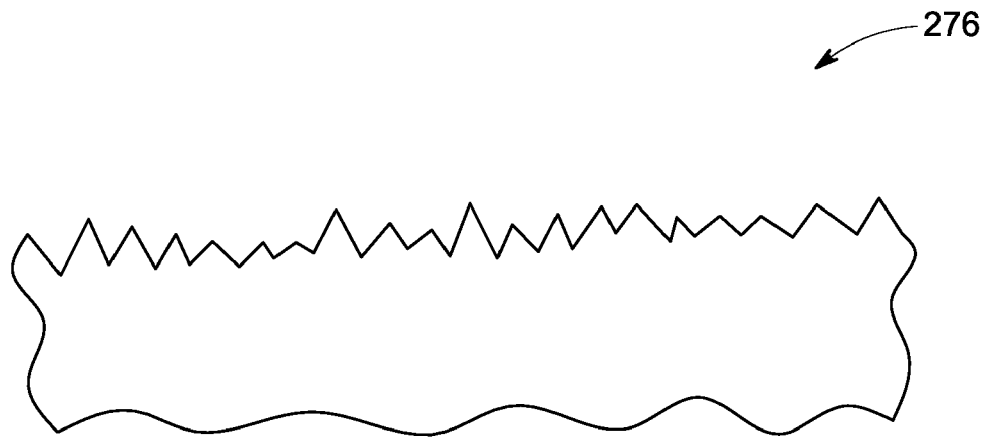
FIGS. 40 to 43 illustrate light management films with different designs that provide surface height randomization.
Figure 41:
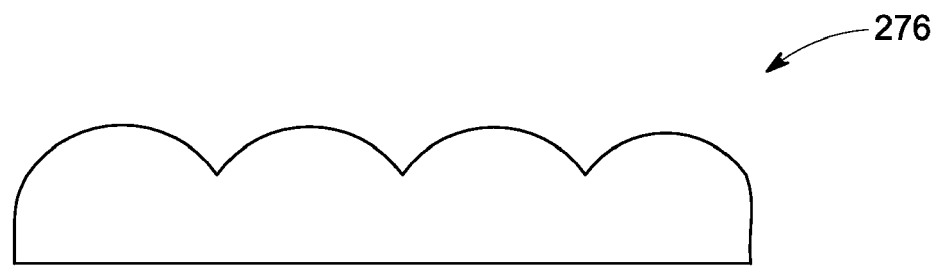
Figure 42:
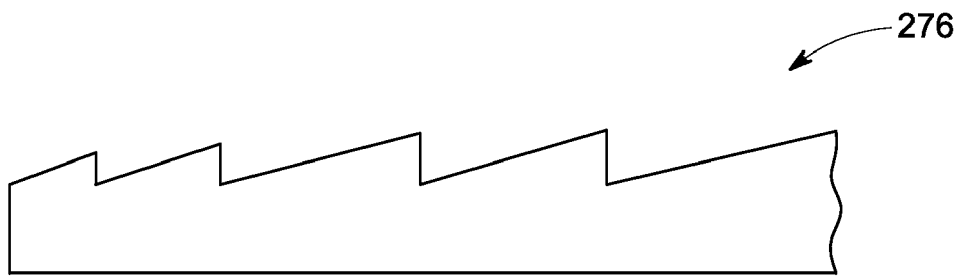
Figure 43:
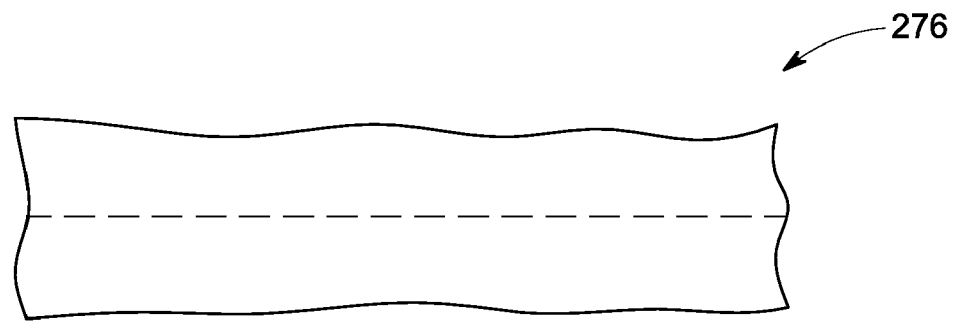

Defects including wet-out and Newton's rings occur when the adjacent surfaces of different layers are smooth and flat. Such defects may be reduced by introducing randomized characteristics or patterns on the layer surface whereby the height of at least one of the film surfaces vary in a random fashion. FIGS. 38 and 39 where a multi-layer display device 260 has a first layer 262 and a second layer 264. The first layer has a first surface 266 and a second surface 268. The second layer has a first surface 270 which has a randomly varying height across the plane of the second layer. The first surface of the second layer has certain local maxima 272 that are sufficiently high as to contact the first layer. There may also be other local maxima 274 that are not sufficiently high to contact the first layer. The random nature of the height minimizes the formation of wet-out regions like those illustrated in FIG. 34. The second layer contacts the first layer only at a number of very small points invisible to the viewer, rather than over a large area as happens with wet-out. When the local maxima of the random height variations are spaced sufficiently close to one another then the appearance of Newton's rings may be reduced. In one embodiment, the light management film may be disposed over the article. In one embodiment, the light management film may be disposed between the different devices in the article or in between the different elements in a device.

Suitable light enhancement films may be flexible or rigid depending on the application. Suitable materials that may be used to prepare the light enhancement films include polymeric materials, such as, for example, acrylics and polycarbonates having nominal indices of refraction of 1.493 and 1.586, respectively. Other useful polymers are polypropylene, polyurethane, polystyrene, polyvinyl chloride, and the like. The particular polymeric material selected is not significant to the invention hereof, so long as it provides the light management function.

The light management films may be suitably designed based on the desired effect. The randomized height variations in light management films may be introduced in the form of prisms/facets formed in any optically useful shape, including lenticular arrays, prisms with rounded peaks and/or valleys, or curved facets, as represented by layers 272 in FIGS. 40 to 43. The variations may include the difference in height of the peaks, depth of the valleys, and periodicity of the peaks/valleys, to provide the desired effects. The surface so formed may be referred to as anti wet-out surface. The anti wet-out surface in the films may be produced using a tool manufactured by any known method. For example, if the tool used to produce the film is a roll, it can be manufactured by thread cutting at a constant thread pitch or plunge cutting using a constant spacing between grooves or any other known method.

Figure 44:
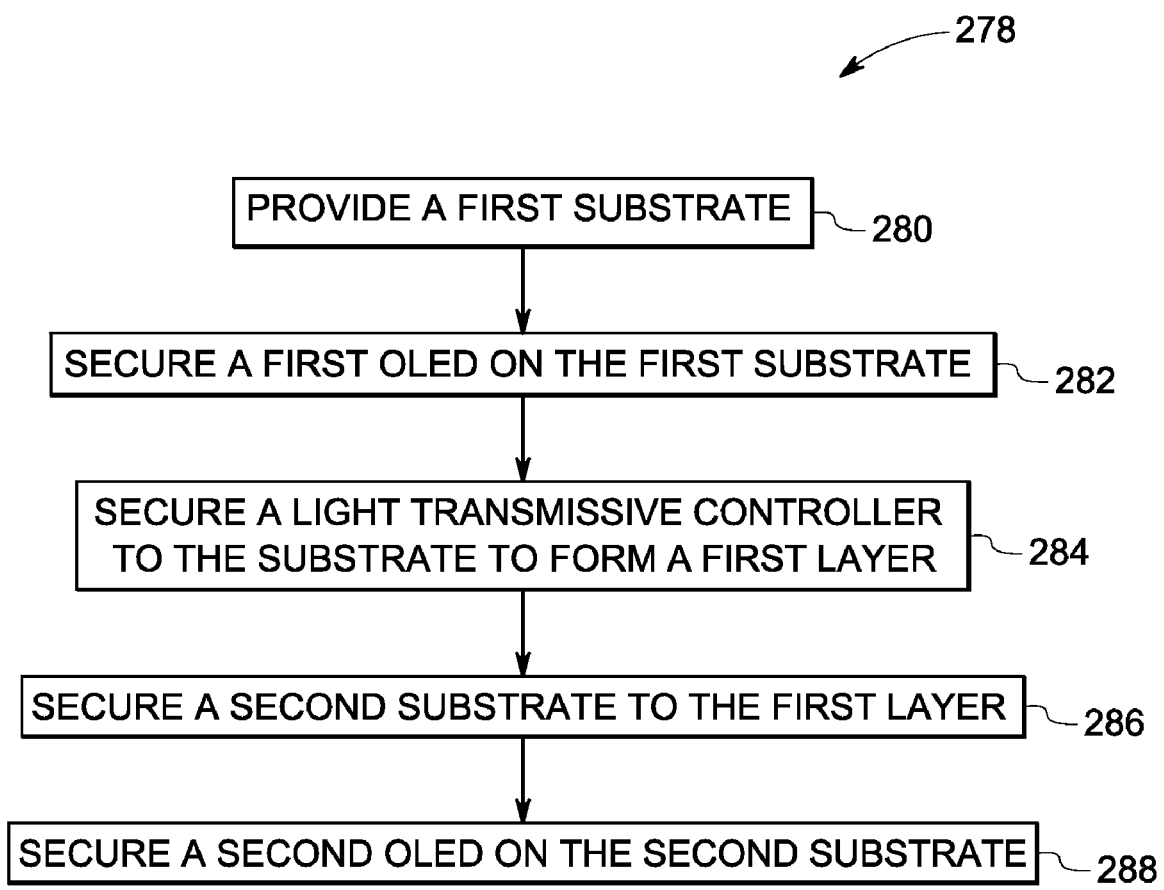
FIG. 44 is a flow chart illustrating a process of fabricating the device according to the invention.

FIG. 44 is a flow chart illustrating an exemplary process 278 of fabricating a device 2 according to aspects of the invention. The process begins with step 280 providing a first substrate light transmissive element, which is, in one embodiment, a glass substrate. In the discussion of FIG. 44, FIG. 1 serves as a useful point of reference. In FIG. 1 the device 2 is pictured as including elements, a light transmissive controller 4, a first light transmissive organic electronic device first OLED 6, a second light transmissive organic electronic device second OLED 14, a first light transmissive element 8, and a second light transmissive element 12. In the next step, 282, a first OLED is secured to the substrate. In a following step 284, light transmissive controller 4 is secured to the first light transmissive element 8 see FIG. 1 to form the first layer 10 of the device 2. In a following step 286, a second substrate 12 is disposed over the first layer 10 of the device 2 see FIG. 1. In a following step 288, a second OLED 14 is secured to the second substrate 12 to form a second layer 16.

Securing or disposing the various layers including the device of the invention may be carried out using known techniques such as spin coating, dip coating, reverse roll coating, wire-wound or MAYER rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic processes, langmuir processes, and flash evaporation, vapor deposition, plasma-enhanced chemical-vapor deposition "PECVD", radio-frequency plasma-enhanced chemical-vapor deposition "RFPECVD", expanding thermal-plasma chemical-vapor deposition "ETPCVD", electron-cyclotron-resonance plasma-enhanced chemical-vapor deposition ECRPECVD", inductively coupled plasma-enhanced chemical-vapor deposition "ICPECVD", and sputtering techniques including reactive sputtering.

Some devices according to embodiments of the invention may be flexible and transparent.

EXAMPLES

The following examples are intended only to illustrate methods and embodiments in accordance with the invention, and as such should not be construed as imposing limitations upon the clauses. Unless specified otherwise, all ingredients are commercially available from such common chemical suppliers as Alpha Aesar, Inc. (Ward Hill, Mass.), Spectrum Chemical Mfg. Corp. (Gardena, Calif.), and the like.

Example 1

EL Material Synthesis

Poly((N,N-ethylmethyl aminomethyl)styrene) (PS-Amine) is synthesized as follows: A solution of an isomeric mixture of poly(3-chloromethyl)styrene and poly(4-chloromethylstyrene) (2 grams, 13.2 millimoles) and N-ethylmethylamine (CAS No. 624-78-2, 11.8 grams, 200 millimoles) in 25 milliliters of toluene is stirred at room temperature for 5 days. The reaction mixture, which is a slurry containing precipitated solids is transferred to a separatory funnel and diluted with toluene. The organic phase is washed twice with 1 weight percent aqueous NaOH solution, twice with water, and the solvent is removed under vacuum. The tacky, white solid residue is dissolved in methanol and precipitated into water in a blender. The collected solid is air-dried, and then dried in a vacuum oven at 50 degrees Celsius to afford the reaction product of poly(N,N-ethylmethyl amino methyl)styrene.

Example 2

A Transparent Organic Light-Emitting Device Fabrication

Step 1: Preparation of a Green-Color Organic Light-Emitting Device (Green OLED).

Glass pre-coated with Indium Tin Oxide (ITO) (Applied Films) is used as the substrate. A layer (ca. 60 nanometers) of poly(3,4-ethylendioxythiophene/polystyrene sulfonate (PEDOT:PSS) (BAYTRON® commercially available from Bayer Corporation (City, State), is deposited onto ultraviolet-ozone treated ITO substrates via spin-coating and then baked for 1 hour at 180 degrees Celsius in air. A layer (ca. 70 nanometers) of a green light-emitting polymer (LEP) (LUMATION® 1304 commercially available from Dow Chemical (City, State) is then spin-coated atop the PEDOT layer. Then the samples are transferred to an argon filled glovebox nominally containing less than 1 parts per million of oxygen and moisture. Next, a layer of PS-amine (ca. about 5 nanometers to 8 nanometers) is spin-coated atop the green LEP from a solution of PS-amine in 1-butanol and baked for 30 minutes at 90 degrees Celsius in air. An ITO layer (ca. 110 nanometers) is sputtered onto the PS-amine layer surface using a CVC601 sputter tool at a base pressure of $1\times10^{-6}$ torr to provide a green OLED. The ITO DC magnetron sputtering is carried out at a pressure of 0.7 millimeter Torr, with 30 standard cubic centimeter of argon and 8.5 standard cubic centimeter of oxygen under a sputter power density of 18.3 watts per square inch.

The samples are electrically grounded, unheated, and placed 1 inch away from sputter target. To achieve uniform ITO coatings, the substrates are kept constantly rotating at 4 seconds per cycle throughout the deposition process. The ITO layer is deposited in 11 minutes, corresponding to a deposition rate of ca. 1.7 Angstrom per second. The ITO coatings so deposited exhibit a sheet resistance of about 45 Ohm per square centimeter.

Optical transmittance is measured with an USB2000 Miniature Fiber Optic Spectrometer commercially available from Ocean Optics (Dunedin, Fla. 34698, USA). The device performance is characterized by measuring current-voltage-luminance (I-V-L) characteristics and electroluminescence spectra. A photodiode calibrated with a luminance meter (MINOLTA LS-110) was used to measure the luminance (in units of candela per square meter, cd/m2). A plot of efficiency (measured in candela per ampere, cd/A) as a function of current density (measured in milliamperes per square centimeter, $mA/cm^2$) is obtained for each device from its I-V-L data.

Step 2: Preparation of a ZnO-Based TFT.

The ZnO-based TFT is fabricated using a bottom gate configuration. A borosilicate glass precoated with 200 nanometers thick ITO film and a 220 nanometers thick atomic layer deposition (ATO) film, obtained from Planar Systems, is used as the substrate. The ITO layer on the substrate having an average transmittance of 85 percent, a resistivity of $2.3\times10^{-4}$ Ohm centimeter, a carrier concentration of $7.7\times10^{20}$ centimeter$^{-3}$, and a mobility of 36 centimeter$^2$/Volt-seconds$^6$, serves as the gate electrode. The ATO film composed of a superlattice of alternating layers of $Al_2O_3$ and $TiO_2$, serves as the gate insulator. The ATO has a measured capacitance of about 60 nanoFaradays/centimeter$^2$ with a dielectric constant of about $16\in_0$. First, a ZnO film 100 nanometers thick is deposited by sputtering on the precoated borosilicate glass using a RF (13.56 MHz) magnetron system. Next, the drain electrode and source electrode, both 300 nanometers thick ITO layers, are patterned on the borosilicate glass using the etching technique.

The resultant thin film bottom-gate type ZnO TFT shows good device performance of about 1 square centimeter/volts-.second, on-off ratio of greater than 105, and a gate voltage swing of 4 volt/decade. The TFT also shows a transparency of about 80 percent at a wavelength of 550 nanometers of visible light.

Step 3: Preparation of a Light-Emitting Device

A layer of glass 500 nanometers thick and having a percentage transparency of 90 at a wavelength of 550 nanometers is the light transmissive layer. The green-OLED prepared in step 1 and the ZnO-based TFT prepared in step 2 are both secured to the glass to form a first layer device. A second layer of glass is disposed over the first layer of the device. A second green-OLED secures to the second glass layer. The active emitting-areas of the two OLEDs overlap. The TFT is operably coupled with both the green-OLEDs. The assembly is aligned such that the color emitted consists of the light emitted by both the OLEDs based on the on-off condition of the TFT controller. The edges of the assembly were then sealed with the NORLAND ADHESIVE to provide mechanical integrity.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. A device, comprising:
   a light transmissive element;
   a nano-wire light-emitting device; and
   a light transmissive controller communicating with the nano-wire light-emitting device;
   wherein the nano-wire light-emitting device and the light transmissive controller are supported by the light transmissive element.

2. The device as defined in claim 1, wherein the light transmissive element has a percentage transparency of greater than about 50 percent to light in the visible wavelength range.

3. The device as defined in claim 1, wherein the light transmissive element comprises quartz glass or borosilicate glass.

4. The device as defined in claim 1, wherein the light transmissive element comprises an organic polymer.

5. The device as defined in claim 1, wherein the light transmissive controller is a transistor having a percentage transparency of greater than about 50 percent to light in the visible wavelength range.

6. The device as defined in claim 1, wherein the nano-wire light-emitting device comprises:
   an electrically conductive element that is light transmissive; and
   a light-emitting nano-wire in electrical communication with the electrically conductive element, wherein the light-emitting nano-wire comprises a p-n diode or a p-i-n diode, or a plurality of p-n or p-i-n diodes.

7. The device as defined in claim 6, wherein the i-layer comprises a quantum well or a plurality of quantum wells.

8. The device as defined in claim 6, wherein the electrically conductive element comprises a metal or an electrically conducting polymer.

9. The device as defined in claim 8, wherein the metal comprises aluminum, barium, calcium, chromium, gold, silver, nickel, palladium, platinum, titanium, copper, or tungsten.

10. The device as defined in claim 8, wherein the metal is a metal oxide.

11. The device as defined in claim 10, wherein the metal oxide comprises an n-type conductor.

12. The device as defined in claim 11, wherein the n-type conductor comprises indium-tin oxide.

13. The device as defined in claim 10, wherein the metal oxide comprises oxides of zinc, tin, or lanthanum.

14. The device as defined in claim 8, wherein the electrically conducting polymer comprises polyacetylene, polypyrrole, polythiophene, polyaniline, polyfluorene, polynaphthalene, poly-p-phenylene sulfide, or poly-p-phenylene vinylene.

15. The device as defined in claim 6, wherein the electrically conductive element further comprises a substrate that is light transmissive.

16. The device as defined in claim 15, wherein the light transmissive substrate has a percentage transparency of greater than about 50 percent to light in the visible wavelength range.

17. The device as defined in claim 15, wherein the light transmissive substrate comprises quartz glass or borosilicate glass.

18. The device as defined in claim 15, wherein the light transmissive substrate comprises an organic polymer.

19. The device as defined in claim 15, wherein the electrically conductive element has a percentage transparency of greater than about 50 percent to light in the visible wavelength range.

20. The device as defined in claim 6, wherein the nano-wire light-emitting device includes multiple light-emitting nano-wire diodes each including a structure of a p-type semiconducting segment, an n-type semiconducting segment and a light-emitting layer.

21. The device as defined in claim 6, wherein the nano-wire light-emitting device comprises a semi-conductor light-emitting material selected from the group consisting of gallium nitride, zinc selenide, gallium arsenide, and zinc oxide.

22. The device as defined in claim 6, wherein the nano-wire light-emitting device further comprises a cover substrate disposed on the electrically conductive element.

23. The device as defined in claim 22, wherein each of the nano-wire light-emitting device is grown on the electrically conductive element or on the cover substrate.

24. The device as defined in claim 1, wherein the light transmissive controller is connected to at least two nano-wire light-emitting devices.

25. An article comprising a plurality of devices as defined in claim 1, wherein the plurality of devices comprises at least a first device and a second device, each of the first and second devices having contacting surfaces defining a stack, wherein the light-emitting device in the first device comprises a red, green or blue light-emitting element, and the light-emitting device in the second device comprises a red, green or blue light-emitting element with the proviso that the light-emitting element of the second light-emitting device differs from the light-emitting element of the first light-emitting device.

26. The article as defined in claim 25, further comprising a third layer in the stack comprising a red, green or blue light-emitting element with the proviso that the light-emitting element of the third layer, the light-emitting element of the second.

27. The article as defined in claim 25, wherein a pixel visualizable by a viewer is a color defined by the on/off state of the light-emitting devices layers.

28. The article as defined in claim 25, wherein the each of the plurality of devices are arranged relative to each other so that the most transmittable wavelength is transmitted from deeper in the stack.

29. The article as defined in claim 25, further comprising at least one of a barrier layer, an abrasion resistant layer, an adhesion layer, a chemically resistant layer, a photoluminescent layer, a radiation-absorbing layer, a radiation reflective layer, a planarizing layer, an optical diffusing layer, or a light management film.

* * * * *